(12) United States Patent
Mouttet

(10) Patent No.: US 7,378,870 B2
(45) Date of Patent: May 27, 2008

(54) PROGRAMMABLE CROSSBAR SIGNAL PROCESSOR WITH RECTIFICATION LAYER

(76) Inventor: Blaise Laurent Mouttet, 4201 Wilson Blvd., #110-364, Arlington, VA (US) 22203

( * ) Notice: Subject to any disclaimer, the term of this patent is extended or adjusted under 35 U.S.C. 154(b) by 0 days.

(21) Appl. No.: 11/790,712

(22) Filed: Apr. 27, 2007

(65) Prior Publication Data

US 2007/0229111 A1    Oct. 4, 2007

Related U.S. Application Data

(63) Continuation of application No. 11/395,237, filed on Apr. 3, 2006, now Pat. No. 7,302,513.

(51) Int. Cl.
*H03K 19/173* (2006.01)
(52) U.S. Cl. .............................. 326/38; 257/9; 716/17; 977/712
(58) Field of Classification Search .................. 326/38; 257/9; 716/16, 17; 977/712, 940, 943
See application file for complete search history.

(56) References Cited

U.S. PATENT DOCUMENTS

| 4,597,162 A | 7/1986 | Johnson et al. |
| 5,223,750 A | 6/1993 | Nichogi et al. |
| 5,272,359 A | 12/1993 | Nagasubramanian et al. |
| 6,128,214 A | 10/2000 | Kuekes et al. |
| 6,248,674 B1 | 6/2001 | Kamins et al. |
| 6,256,767 B1 | 7/2001 | Kuekes et al. |
| 6,314,019 B1 | 11/2001 | Kuekes et al. |
| 6,432,740 B1 | 8/2002 | Chen |
| 6,518,156 B1 | 2/2003 | Chen et al. |
| 6,531,371 B2 | 3/2003 | Hsu et al. |
| 6,574,130 B2 * | 6/2003 | Segal et al. .................. 365/129 |
| 6,586,965 B2 | 7/2003 | Kuekes et al. |
| 6,693,821 B2 | 2/2004 | Hsu et al. |
| 6,746,971 B1 | 6/2004 | Ngo et al. |
| 6,812,117 B1 | 11/2004 | Tringe |
| 6,835,575 B2 | 12/2004 | Chen |
| 6,846,682 B2 | 1/2005 | Heath et al. |
| 6,854,092 B2 | 2/2005 | Hogg |
| 6,867,996 B2 | 3/2005 | Campbell et al. |
| 6,870,394 B2 | 3/2005 | Kuekes |
| 6,880,146 B2 | 4/2005 | Snider |
| 6,898,098 B2 | 5/2005 | Snider et al. |

(Continued)

OTHER PUBLICATIONS

Ziegler et al.., "A Case for CMOS/nano Co-design", ACM-SIGDA Emeging Technologies Seminar, Nov. 2002.
Lee et al., "CMOL Crossnets as Pattern Classifiers", IWANN, 2005, pp. 446-454, Springer-Verlag Berlin Heidelberg.
Das et al., "Architectures and Simulations for Nanoprocessor Systems Integrated on the Molecular Scale", Introducing Molecular Electronics, 2006, chap. 17, www-mcg.uni-r.de.
Koch, "Morphware", Scientific American, Aug. 2005, vol. 293, No. 2, pp. 56-63, Scientific American Inc.

*Primary Examiner*—Daniel D Chang

(57) ABSTRACT

A device includes a rectifying layer having a first side and a second side, a first array of wires formed above the first side of the rectifying layer, and a second array of wires formed below the second side of the rectifying layer.

10 Claims, 32 Drawing Sheets

U.S. PATENT DOCUMENTS

| | | |
|---|---|---|
| 6,900,479 B2 | 5/2005 | DeHon et al. |
| 6,919,740 B2 | 7/2005 | Snider |
| 6,960,783 B2 | 11/2005 | Lan et al. |
| 6,963,077 B2 | 11/2005 | DeHon et al. |
| 6,995,649 B2 | 2/2006 | Nugent |
| 6,998,333 B2 | 2/2006 | Chen et al. |
| 2004/0150010 A1 | 8/2004 | Snider |
| 2005/0258872 A1 | 11/2005 | Snider |

* cited by examiner

Input Selector Circuit

Output Selector Circuit

Fig.10a
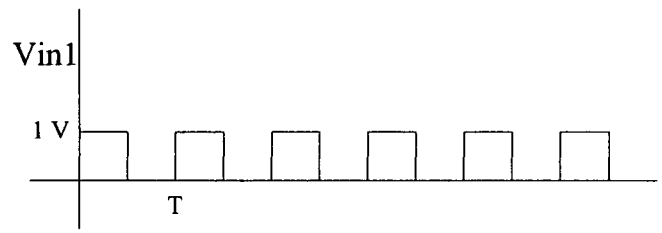
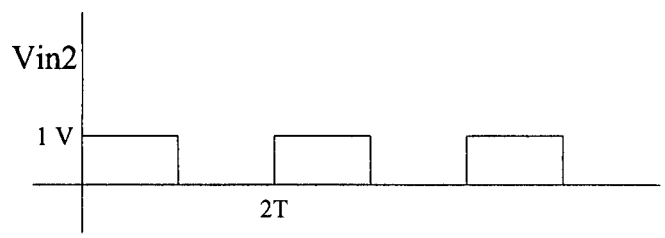
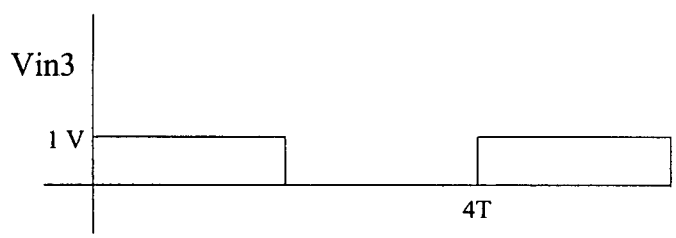
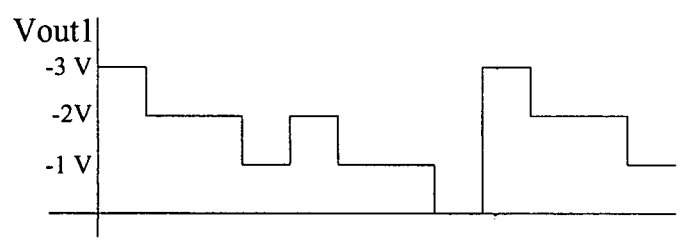
Fig.10b
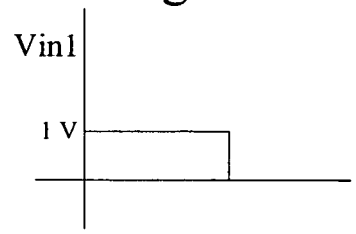
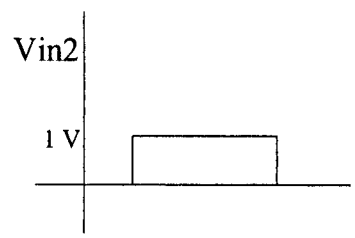
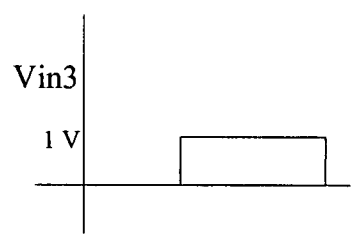
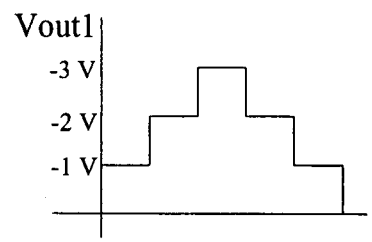
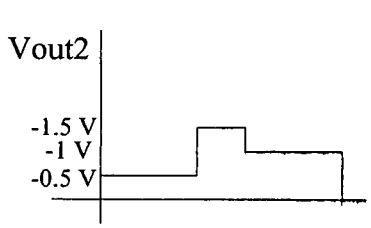

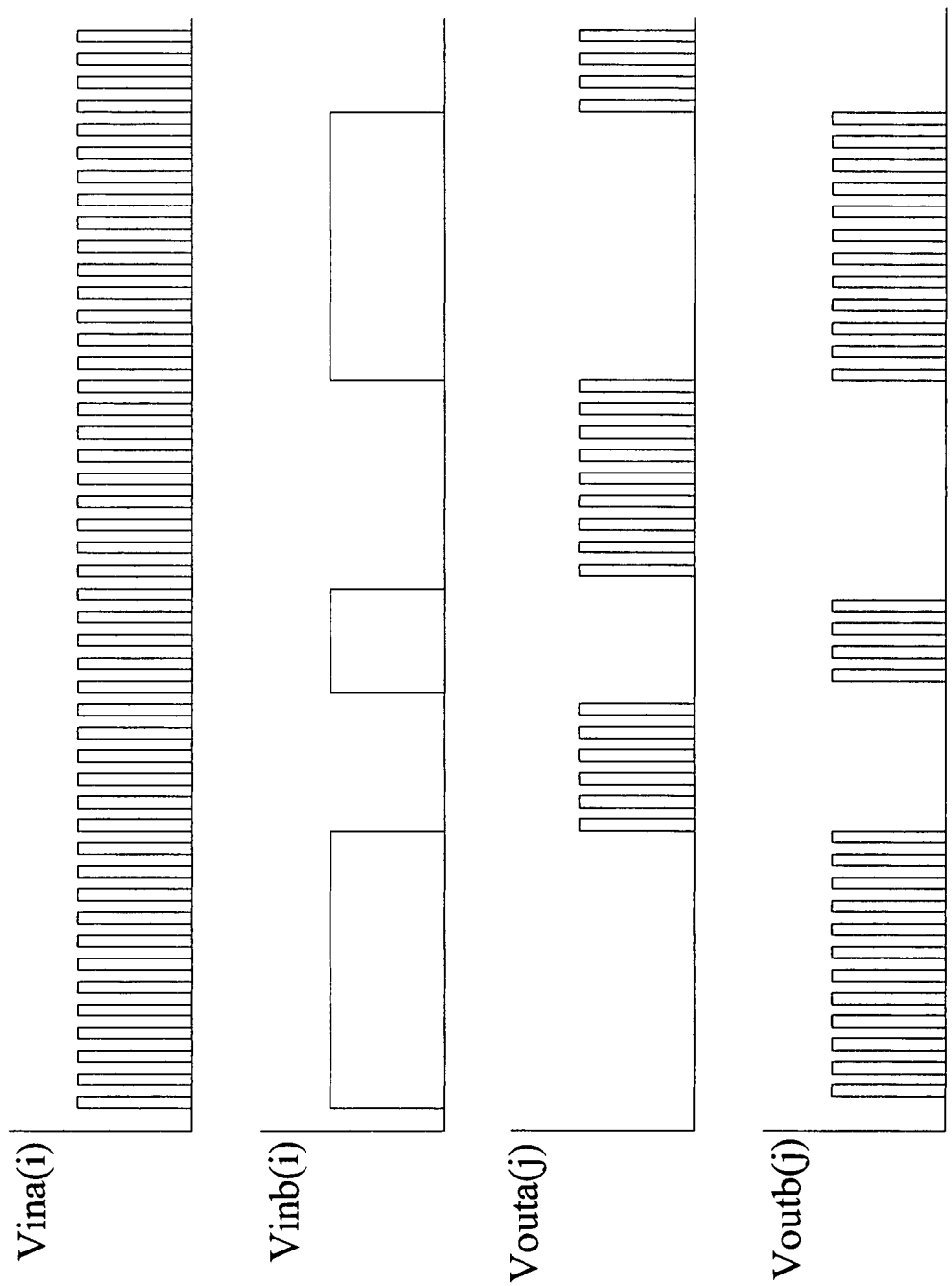

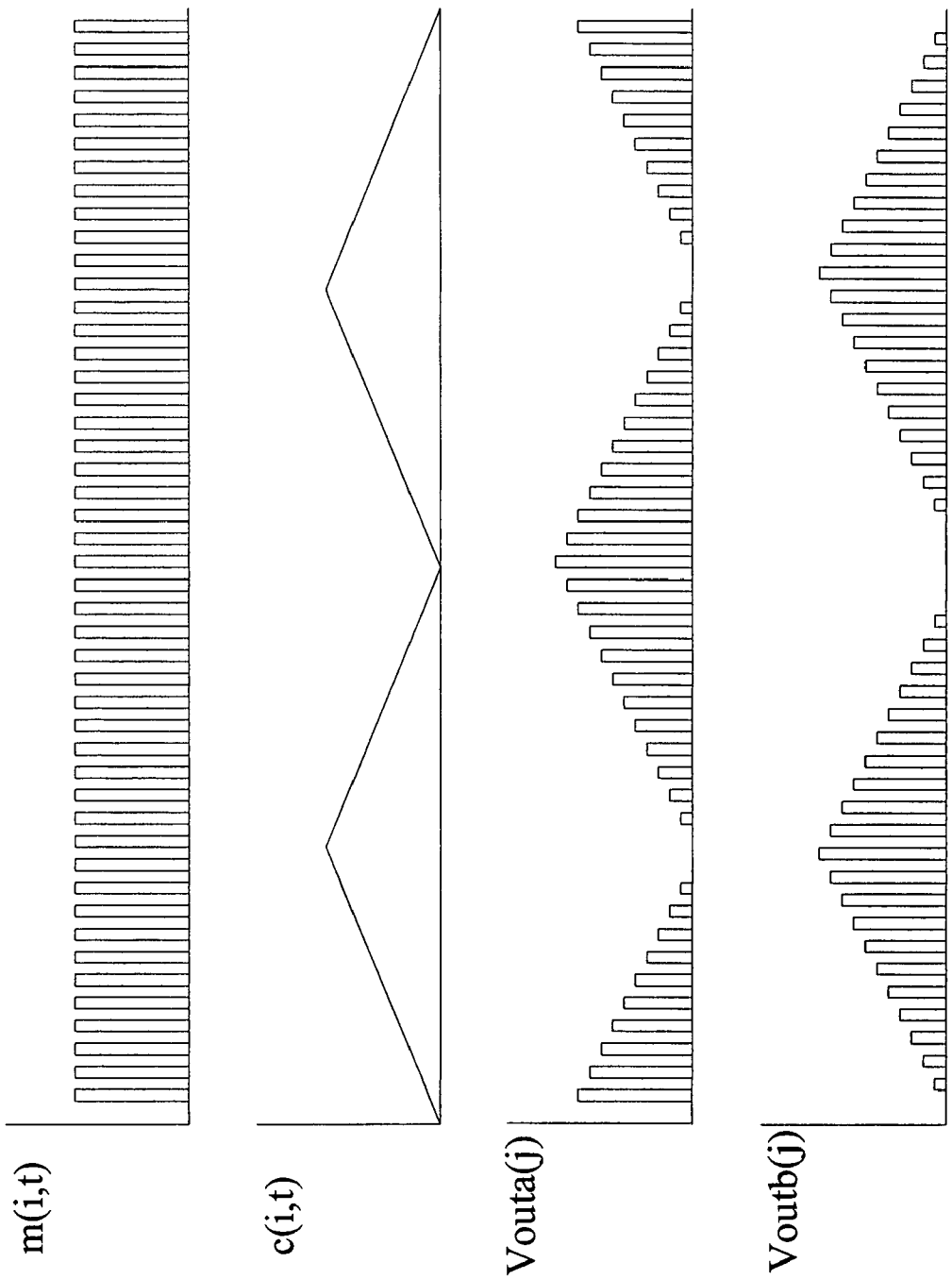

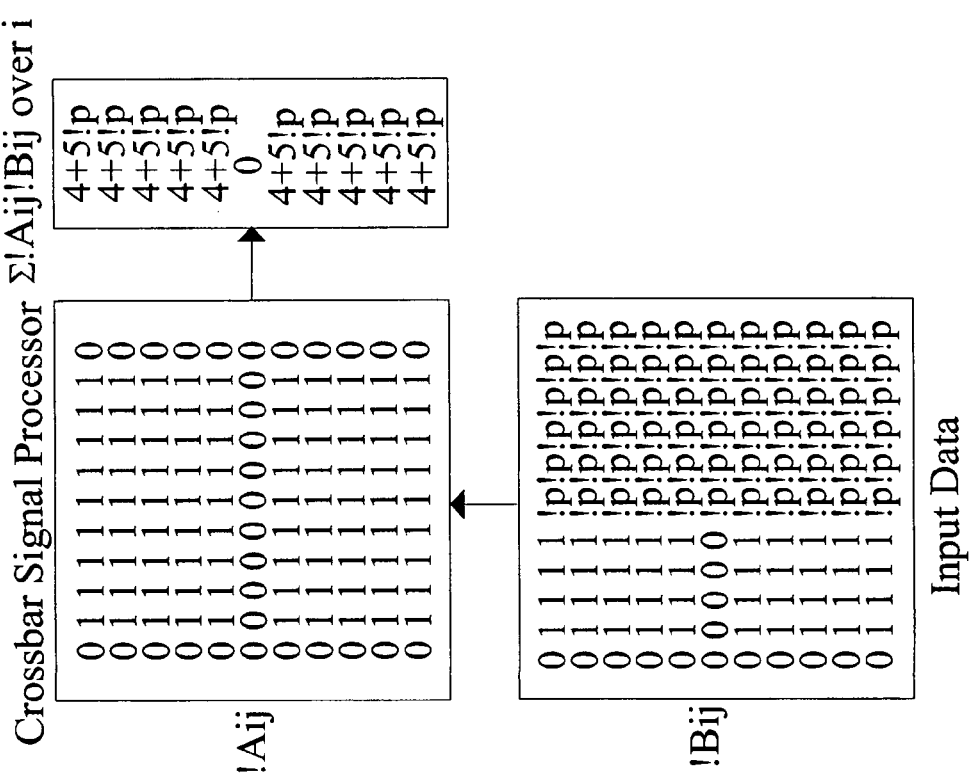
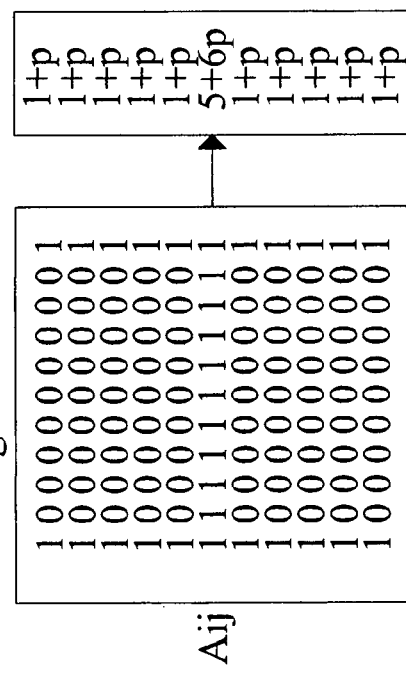
Fig.22b
Fig.22a

Fig.22e $$D_j = \Sigma[A_{ij}B_{ij} + !A_{ij}!B_{ij}] \text{ over } i$$

| |
|---|
| 10-4p |
| 10-4p |
| 10-4p |
| 10-4p |
| 5+6p |
| 10-4p |
| 10-4p |
| 10-4p |
| 10-4p |
| 10-4p |

$$D_j/M \ (p=0.5, M=11)$$

| |
|---|
| 0.73 |
| 0.73 |
| 0.73 |
| 0.73 |
| 0.73 |
| 0.73 |
| 0.73 |
| 0.73 |
| 0.73 |
| 0.73 |

$$C_i = \Sigma[A_{ji}B_{ji} + !A_{ji}!B_{ji}] \text{ over } j$$

| |
|---|
| 11 |
| 11 |
| 11 |
| 11 |
| 11 |
| 10-9p |
| 10-9p |
| 10-9p |
| 10-9p |
| 11p |

$$C_i/N \ (p=0.5, N=11)$$

| |
|---|
| 1 |
| 1 |
| 1 |
| 1 |
| 1 |
| 0.5 |
| 0.5 |
| 0.5 |
| 0.5 |
| 0.5 |

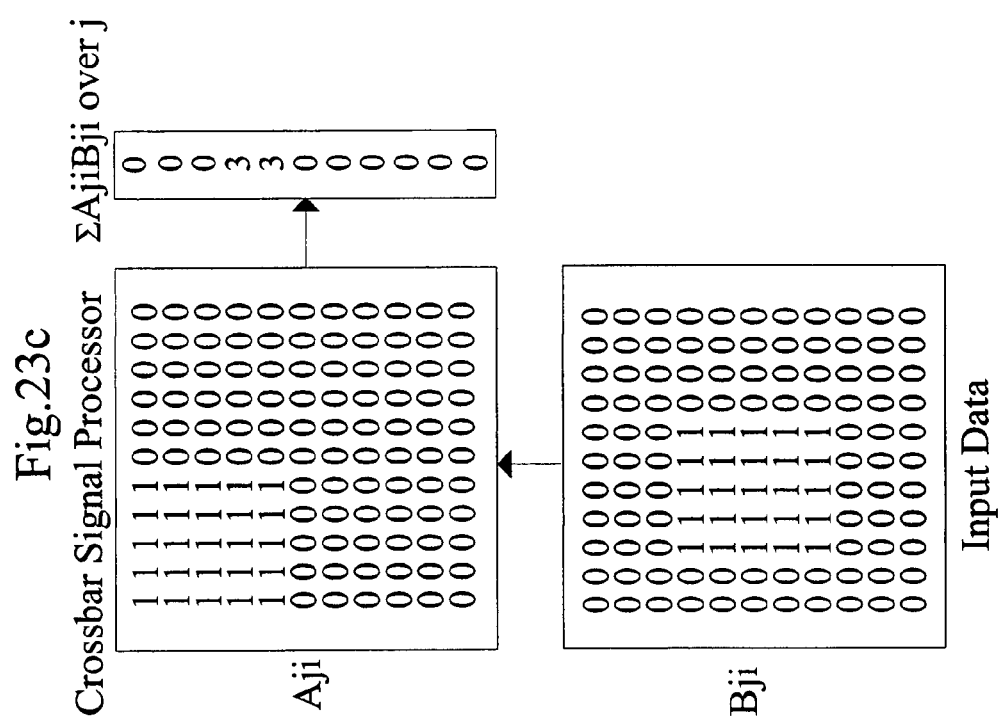

Fig.23e $$D_j = \Sigma[A_{ij}B_{ij} + (N-!A_{ij}!B_{ij})] \text{ over } i$$

| 5 |
|---|
| 5 |
| 10 |
| 10 |
| 5 |
| 5 |
| 5 |
| 0 |
| 0 |
| 0 |

$$C_i = \Sigma[A_{ji}B_{ji} + (M-!A_{ji}!B_{ji})] \text{ over } j$$

| 5 |
|---|
| 5 |
| 5 |
| 10 |
| 10 |
| 5 |
| 5 |
| 5 |
| 0 |
| 0 |
| 0 |

DjCi

```
025 025 050 050 050 025 025 025 000 000
025 025 050 050 050 025 025 025 000 000
050 050 100 100 100 050 050 050 000 000
050 050 100 100 100 050 050 050 000 000
025 025 050 050 050 025 025 025 000 000
025 025 050 050 050 025 025 025 000 000
025 025 050 050 050 025 025 025 000 000
000 000 000 000 000 000 000 000 000 000
000 000 000 000 000 000 000 000 000 000
000 000 000 000 000 000 000 000 000 000
```

→

$X_{ij} = D_j C_i / (4NM)$

```
0.05 0.05 0.10 0.10 0.10 0.05 0.05 0.05 0.00 0.00
0.05 0.05 0.10 0.10 0.10 0.05 0.05 0.05 0.00 0.00
0.10 0.10 0.21 0.21 0.21 0.10 0.10 0.10 0.00 0.00
0.10 0.10 0.21 0.21 0.21 0.10 0.10 0.10 0.00 0.00
0.05 0.05 0.10 0.10 0.10 0.05 0.05 0.05 0.00 0.00
0.05 0.05 0.10 0.10 0.10 0.05 0.05 0.05 0.00 0.00
0.05 0.05 0.10 0.10 0.10 0.05 0.05 0.05 0.00 0.00
0.00 0.00 0.00 0.00 0.00 0.00 0.00 0.00 0.00 0.00
0.00 0.00 0.00 0.00 0.00 0.00 0.00 0.00 0.00 0.00
0.00 0.00 0.00 0.00 0.00 0.00 0.00 0.00 0.00 0.00
```

PROGRAMMABLE CROSSBAR SIGNAL PROCESSOR WITH RECTIFICATION LAYER

This application is a Continuation of the U.S. patent application Ser. No. 11/395,237, filed Apr. 3, 2006 now U.S. Pat. No. 7,302,513.

CROSS-REFERENCE TO RELATED APPLICATIONS

This application is related to the following co-pending patent application, which is incorporated by reference in its entirety:

U.S. application Ser. No. 11/395,232, entitled "Crossbar Arithmetic Processor," filed Apr. 3, 2006.

FIELD OF THE INVENTION

The present invention pertains to signal processing as used in a variety of applications including control systems, communication systems, and pattern recognition systems. Some aspects of the present invention also relate to molecular electronics and interfaces between solid state electronics and molecular electronics.

BACKGROUND OF THE INVENTION

Crossbar interconnect technology has been developed in recent years with a primary focus in applications in information storage and retrieval. A crossbar array basically comprises a first set of conductive parallel wires and a second set of conductive parallel wires formed so as to intersect the first set of conductive wires. The intersections between the two sets of wires are separated by a thin film material or molecular component. A property of the material, such as the material's resistance, may be altered by controlling the voltages applied between individual wires from the first and second set of wires. Alteration of the materials resistance at an intersection may be performed so as to achieve a high resistance or low resistance state and thus store digital data. It is noted that crossbar arrays are occasionally referred to as cross point or crosswire arrays.

Nagasubramanian et al. U.S. Pat. No. 5,272,359 discloses such a crossbar array employing an organic conducting polymer as the material. Resistance variation from $10^{12}$ ohms to $10^7$ ohms is reported to be achieved by applying a 10V pulse with a 100 ms duration. Nagasubramanian et al. discusses the uses of the crossbar array as forming a memory matrix for an artificial neural net.

Other materials useful for electrically programmable resistance are those with a perovskite structure such as magnetoresistive materials (U.S. Pat. Nos. 6,531,371 and 6,693,821), a variety of organic semiconductors (U.S. Pat. Nos. 6,746,971 and 6,960,783), and silver-selenide/chalcogenide laminate films (U.S. Pat. No. 6,867,996).

Kuekes et al. U.S. Pat. No. 6,128,214 uses crossbars applicable at nanometer scales by employing molecular components as a bridging component between the wires. Such nanoscale crossbars have been disclosed as useful tools in molecular electronics capable of performing a variety of tasks including signal routing, multiplexing, and performing simple logic functions in U.S. Pat. Nos. 6,256,767, 6,314,019, 6,518,156, 6,586,965, 6,812,117, 6,854,092, 6,858,162, 6,870,394, 6,880,146, 6,898,098, 6,900,479, 6,919,740, 6,963,077, and U.S. Patent Application 2005/0258872. Molecular crossbar arrays used in neural networks is disclosed in U.S. Patent Application 2004/0150010 Manufacturing of molecular crossbar arrays is taught in U.S. Pat. Nos. 6,248,674, 6,432,740, 6,835,575, 6,846,682, and 6,998,333.

Examples of non-patent literature concerned with molecular crossbar arrays include Ziegler et al. "A Case for CMOS/nano Co-design," Lee et al. "CMOL Crossnets as Pattern Classifiers," and Das et al. "Architectures and Simulations for Nanoprocessor Systems Integrated On the Molecular Scale." Reinhold Koch provides a discussion of programmable crossbar arrays formed from ferroelectric material in Scientific American Vol. 293, No. 2 pgs. 56-63.

While there are numerous teachings of using programmable crossbar arrays in memory devices and to achieve simple signal routing and logic functions, there has been no significant development in the use of programmable crossbar arrays in processing signals. Enhanced processing speed and adaptability may be attained by employing crossbar arrays in waveform generation, signal filtering, broadband communication, and pattern recognition applications.

SUMMARY OF THE INVENTION

As opposed to storing data, attempting to recreate the basic logic functions used in digital logic, or create a neural net, the present invention proposes an implementation of a crossbar array as a component of a system which, given a first set of analog or digital input signals, can transform the signals into a second set of analog or digital output signals based on preprogrammed values stored in the crossbar array. Employing particular modifications of the crossbar array structure allows for preprogrammed impedance values (Zij) to uniquely determine transfer function coefficients (Tij) for the crossbar and, when combined with specific input and output circuitry, creates a physical device capable of performing a linear transformation of the input signals into output signals. This introduces a new level of parallel processing and adaptability to signal processing applicable to wave function generation, control systems, signal filtering, communications, and pattern recognition.

BRIEF DESCRIPTION OF THE DRAWINGS

FIGS. 10a and 10b illustrate waveforms obtainable when the crossbar processor is used as a waveform generator.

FIG. 11b illustrates a cross-section of the reprogrammable crossbar array of FIG. 11a.

FIG. 12b illustrates a cross-section of the reprogrammable crossbar array of FIG. 12a.

FIGS. 14-16 illustrates modulation waveforms produced using the crossbar array processor.

FIGS. 22a-22e illustrate comparison between the bit data blocks Aij, !Aij, Aji, !Aji and bit data blocks Bij, !Bij, Bji, !Bji using a crossbar processor.

FIGS. 23a-23e illustrate a technique of pattern tracking using a crossbar processor.

DETAILED DESCRIPTION

I. Basic Outline of Crossbar Signal Processor.

Figure 1:
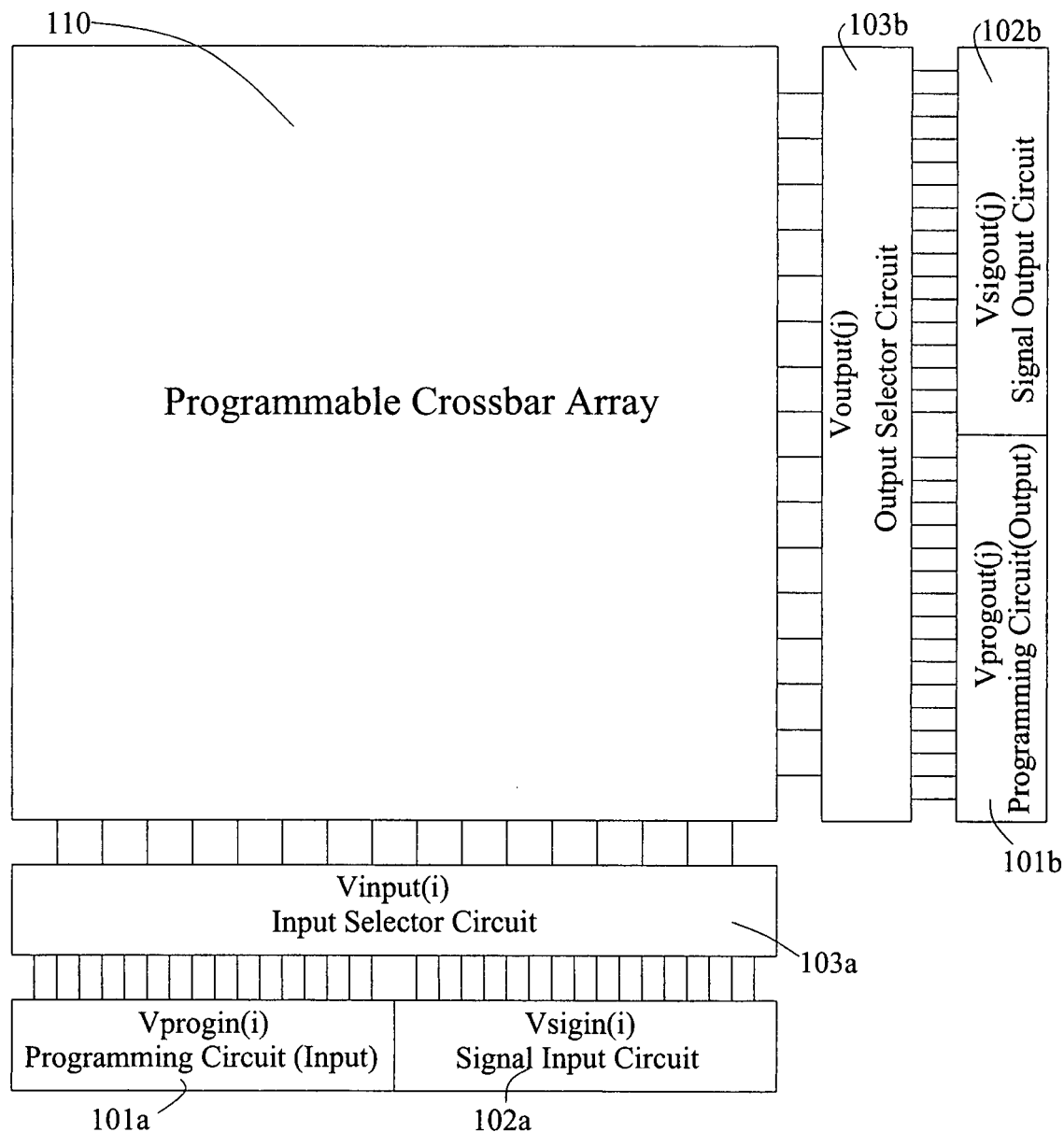
FIG. 1 illustrates a basic circuit configuration for one embodiment of the crossbar signal processing unit of the present invention.

FIG. 1 shows a basic circuit configuration for one embodiment of the signal processing unit of the present invention. The programmable crossbar array 110 comprises a first set of conductive parallel wires and a second set of conductive parallel wires formed substantially perpendicular to the first set of conductive wires. The intersections between the two sets of wires are separated by a thin film material or molecular component. A property of the material, such as the material's resistance, may be altered by controlling the voltages applied between individual wires from the first and second set of wires. The specific programmable material or molecular component utilized may be any one of the materials noted in the prior art references cited in the Background of the Invention or any other known or future developed material or molecular component having an intrinsic impedance-related property such as resistivity, permeability, permittivity, or tunneling probability, that is alterable by an application of a voltage or current above a particular threshold.

As shown in FIG. 1, 16 input lines and 16 output lines are formed to connect the crossbar array 110 to external circuitry. However, depending on the desired application, more or less input and/or output lines may be provided. For example, for a multiplexing operation used in a communications application, more input lines would typically be provided than output lines. If a demultiplexing operation is desired more output lines may be necessary than input lines.

Programming circuits 101a and 101b are provided to set up the initial conditions for the crossbar array 110. For example, if the programmable material used is one in which the resistance is altered when a voltage greater than a particular threshold is applied, then circuits 101a and 101b may be used to set the resistance level at each point of intersection of the crossbars. Further details of one particular circuit configuration for the programming circuits may be found in the description of FIG. 4.

Signal input circuit 102a and output circuit 102b are provided to provide a signal input in the form of a set of analog or digital waveforms into and out of the crossbar array. Further details of particular circuit configurations for the input and output circuits 102a, 102b may be found in the description of FIGS. 7a-7c.

Input and output selection circuits 103a and 103b are provided to selectively connect either the programming circuits 101a, 101b or the signal input/output circuits 102a, 102b to the crossbar array 110.

The intended result of this circuit design is to produce a set of outputs $V_{out}(j) (1 \leq j \leq 16)$ from a set of inputs $V_{in}(i)$ $(1 \leq i \leq 16)$ such that $V_{out}(j) = \Sigma T(i,j) V_{in}(i)$ where the sum is over all i from 1 to 16. The programming circuits 101a, 101b determine the 256(16×16) values of T(i,j) by appropriately setting the resistance values of the crossbar array 110. The input circuit 102a is the source of the signals $V_{in}(i)$ while output circuit 102b transfers the output signals $V_{out}(j)$ to a next circuit stage or to final load elements desired to be driven. This transformation is noted to be identical to a vector transformation by matrix multiplication. While matrix multiplication is commonplace in mathematics and software processes it may take several process steps for an Arithmetic Logic Unit of a conventional microprocessor to perform such an operation. However, given a programmed crossbar array this operation may be performed in a single step saving significant process time.

II. Input/Output Selector Circuits

Figure 2:
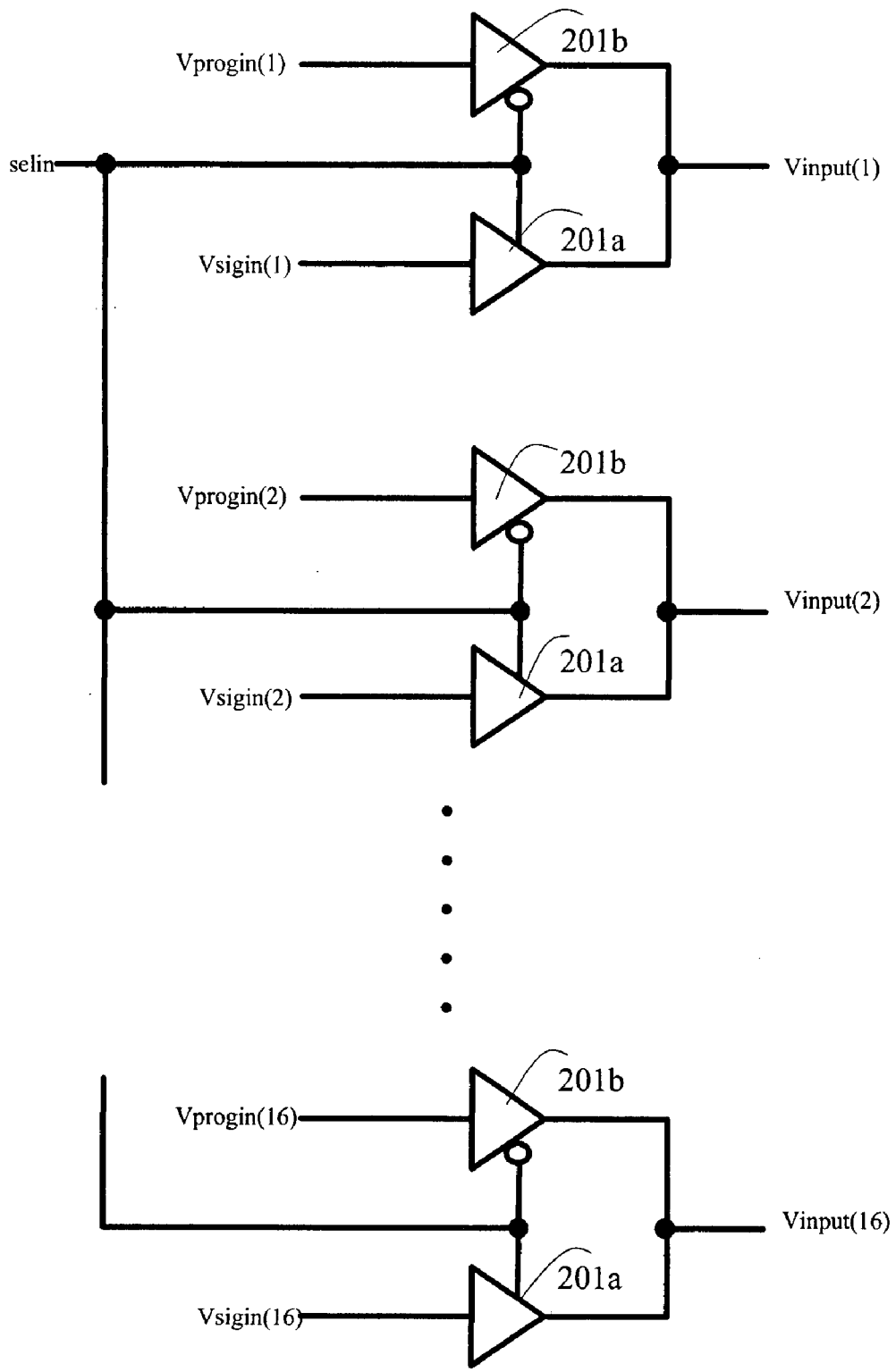
FIG. 2 illustrates an example of an input selector circuit.

FIG. 2 provides one possible example of an input selector circuit 103a. Control signal selin, generated on the basis of a controller circuit, is used to determine whether the signals Vprogin(i) or the signals Vsigin(i) are to be transferred to the crossbar array as Vinput(i). Circuit elements 201a represent three-state buffer gates with driving voltages tuned to the magnitude of the respective Vsigin signals. Circuit elements 201b represent three-state buffer gates with inverted control inputs tuned to the drive voltage of the respective Vprogin signals. When control input selin is at a logical LOW value a high impedance state exists in circuit elements 201a while circuit elements 201b are in a transmission state. In this case the Vprogin(i) signals are transmitted. When control input selin is at a logical HIGH value a transmission state exists in circuit elements 201a while circuit elements 201b are in a high impedance state. In this case the Vsigin(i) signals are transmitted. The ideal cumulative output of the selector circuit may be expressed as $$V\text{input}(i) = ![\text{selin}] * V\text{progin}(i) + [\text{selin}] * V\text{sigin}(i), \quad \text{(Eq1)}$$

wherein selin=logic 1 or logic 0, ! represents the logic NOT operation, * represents the logic AND operation, and + represents the logic OR operation.

Figure 3:
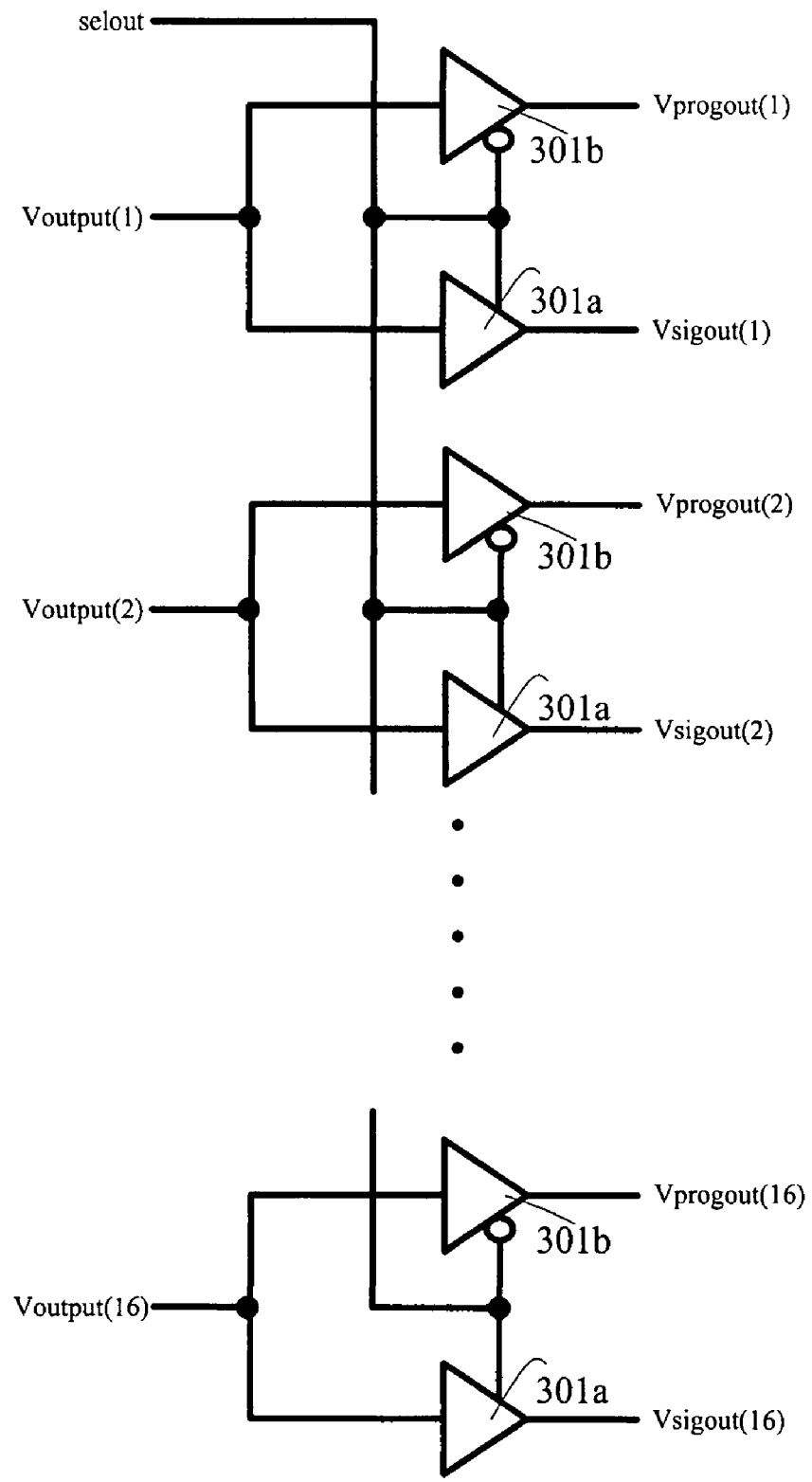
FIG. 3 illustrates an example of an output selector circuit.

FIG. 3 shows an example of an output selector circuit with control signal selout determining the transmission of Voutput(j). In a similar fashion to the analysis of FIG. 2, an analysis of the circuit of FIG. 3, with reference 301*a* referring to three-state buffer gate and 301*b* referring to a three-state buffer gate with an inverted control input, results in $$V\text{progout}(j)=![\text{selout}]*V\text{output}(j), \quad \text{(Eq2a)}$$

$$V\text{sigout}(j)=[\text{selout}]*V\text{output}(j), \quad \text{(Eq2b)}$$

wherein selout=logic 1 or logic 0.

While the circuit configurations of FIG. 2 and FIG. 3 are examples of circuits that may achieve the desired functions (1), (2a), and (2b) any other equivalent circuit performing identical functions may be used, or a general purpose microprocessor may be employed, to achieve the desired output. Particularly in cases of specific applications involving high frequency or high power signals, and depending on the type and properties of the programmable material used in the crossbar array, different circuit components and configurations specifically designed for those conditions may be desirable.

III. Programming Circuits

Figure 4A:
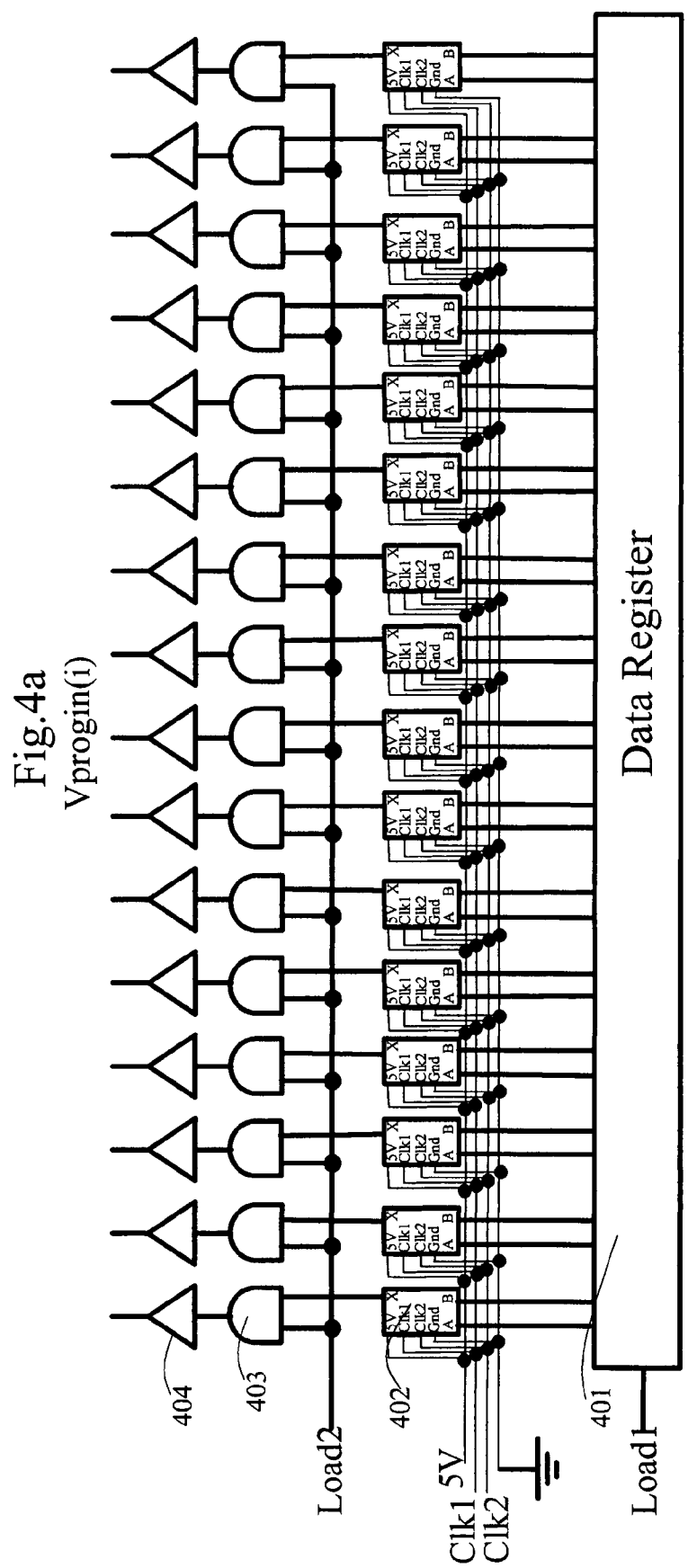
FIG. 4a and FIG. 4b illustrate an example of a programming input and output circuit.
Figure 4B:
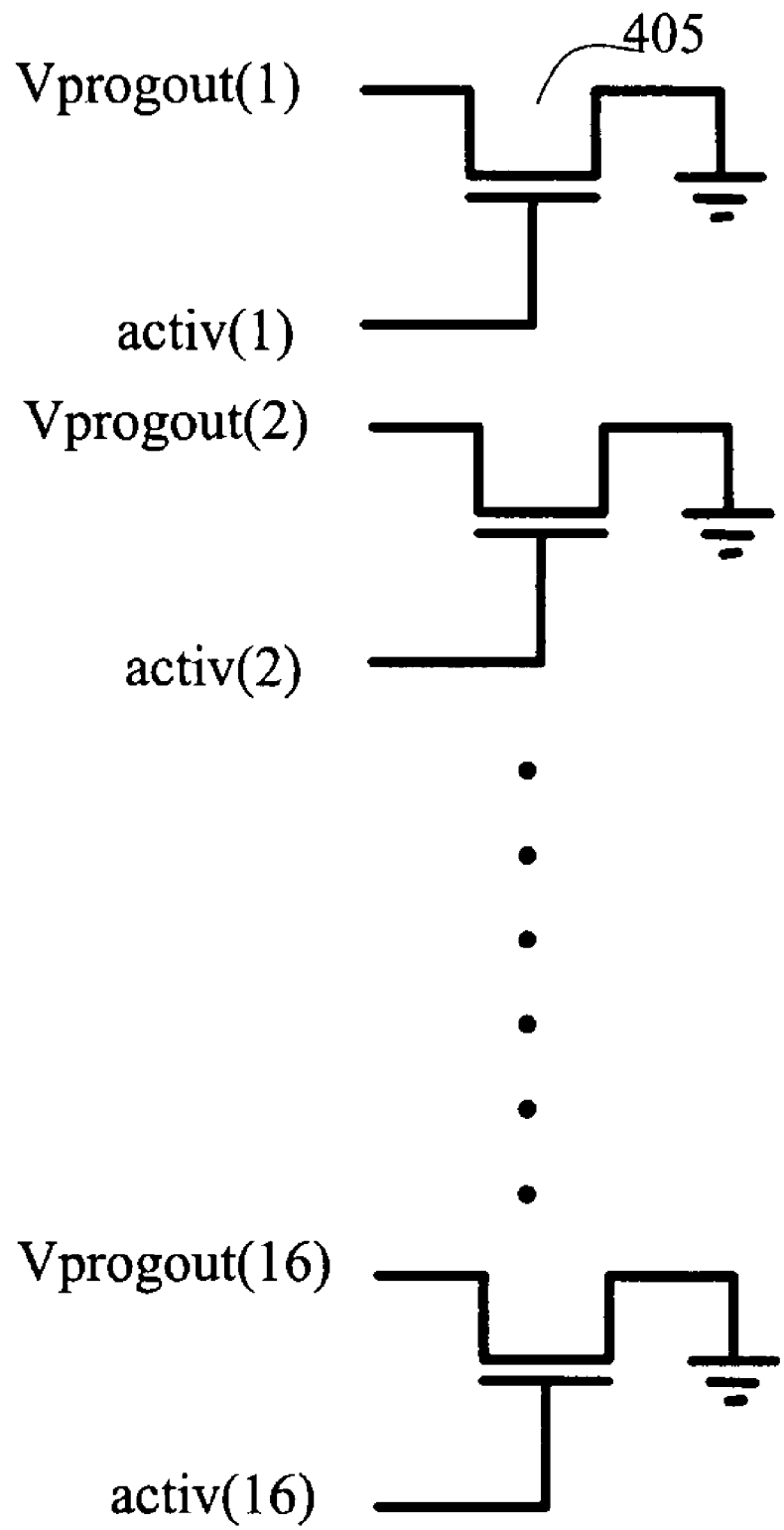

FIG. 4*a* and FIG. 4*b* show a possible configuration of the programming input and output circuits 101*a* and 101*b* with control inputs Load1, Load2, Clk1, Clk2, and activ(1)-activ (16) produced from an external control unit. The desired function of input circuit 101*a* is to selectively set the voltage magnitude and duration of programming pulses to be applied to the crossbar array so that the crossbar array behaves as transfer function T(i,j). Data register 401 may be a ROM, PROM, or EEPROM in which various blocks of binary data corresponding to a variety of different transfer functions T(i,j) desired to be programmed into the crossbar array may be stored at various addresses or the ROM/PROM/EEPROM. Taking the example of a 16×16 crossbar as shown in FIG. 1, each data block may be 16 bits×16 bits in the case where the individual resistance values of the crossbar are intended to be programmed with either a high or low resistance state. Taking the teachings of Nagasubramanian et al. U.S. Pat. No. 5,272,359 as an example, the high state of $10^{12}$ ohms and low state of $10^7$ ohms was achieved by applying a 100 ms pulse. If, in addition to a high and low resistance values, intermediate resistance values are desired to be programmed into the crossbar the duration of the pulse used may be adjusted to achieve such intermediate values. In the case where a conductive polymer is used as the resistive material of the crossbar array, control of the initial doping concentration may be used as a means to regulate the amount of resistance variation with respect to the applied voltage.

In order to achieve intermediate resistance states using stored data blocks larger blocks of binary data are necessary. For example, if one of four possible resistance states were desired to be programmed at every intersection of a 16×16 crossbar, this may be accomplished by providing a data block of size 32 bits×16 bits since 2 bits may achieve one of four possible resistance states corresponding to 00, 01, 10, and 11. This principle may be understood further by an explanation of the circuitry of FIG. 4*a*, the block data of FIG. 5, and the waveforms of FIG. 6.

Figure 5:
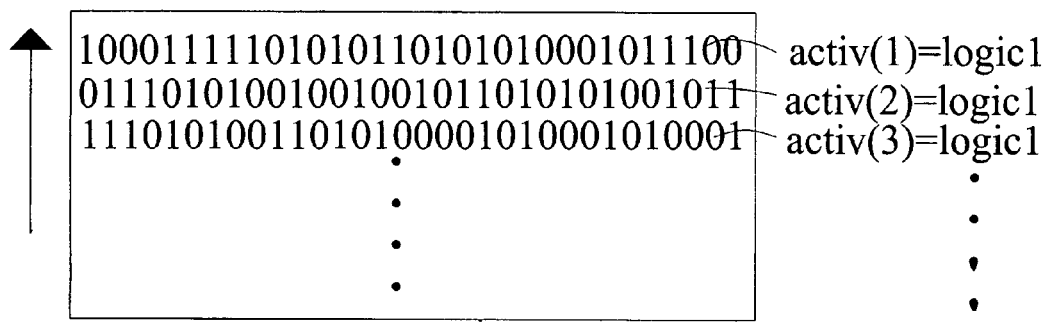
FIG. 5 illustrates data from a particular block of a data register.
Figure 6:
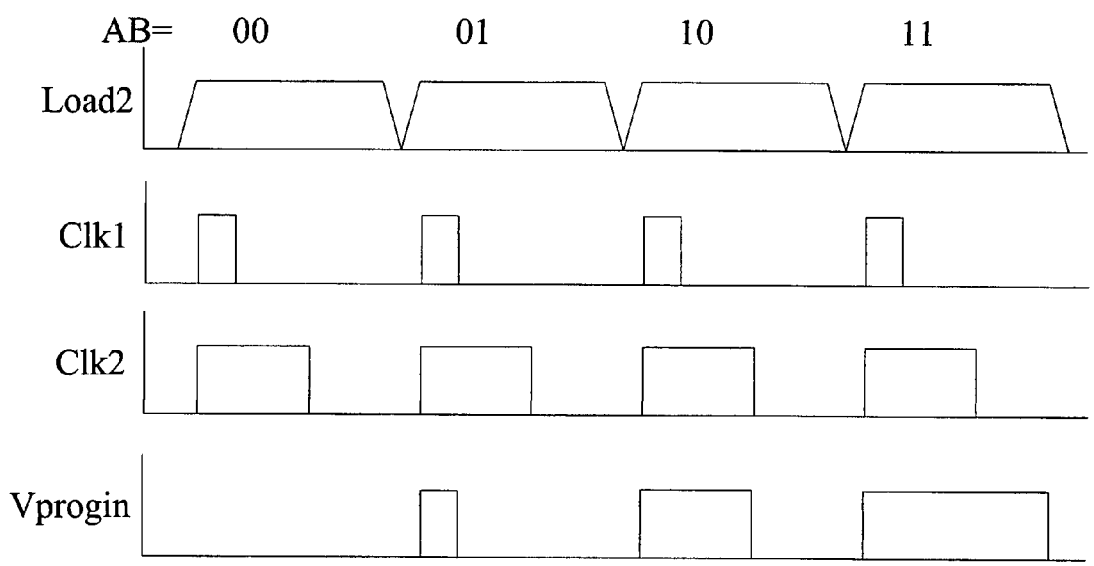
FIG. 6 illustrates programming waveforms used to program a crossbar array.

Data from a particular block of data register 401 is shown in FIG. 5. The first row of data in the block consists of a series of plural bits 10, 00, 11, 11, etc. and is used to program the resistance values of the first row of the crossbar array. This data may be loaded into multiplexers 402 via control signal Load1 which outputs one of 4 signals based on the binary input provided. If the input is 00, the output X is a LOW logic level 0 (such as 0V or −12 V depending on the specific logic devices used); if the input is 01, the output X is a first clock signal Clk1 having a small duty cycle; if the input is 10, the output X is a second clock signal Clk2 having a larger duty cycle; if the input is 11, the output X is a HIGH logic voltage 1 (such as 5 V, 12V, etc. the value depending on the specific logic devices used.) In summary, $$X = Logic0 *![A]*![B] + \quad \text{(Eq 3)}$$
$$Clk1*![A]*[B] + Clk2*[A]*![B] + Logic1*[A]*[B],$$

wherein A and B are each either logic 0 or 1 and the clock signals Clk1, Clk2 have a high voltage corresponding to logic 1 and a low voltage corresponding to logic 0.

Each of the outputs X are connected to a AND gate 403 with the other inputs of the AND gates 403 being connected to control signal Load2 so as to regulate when the pulses X are transferred to drive circuitry 404. Drive circuitry 404 includes boosting/amplifying circuitry to transform the logic voltages into drive voltages Vp capable of altering the impedance of the programmable material in the crossbar array. The table below indicates the values of a particular programming voltage Vprogin(i) given Load2 and particular binary inputs AB (AB=XX referring to any possible binary input.)

TABLE 1

| Load2 | AB | Vprogin(i) |
|---|---|---|
| 0 | XX | GND |
| 1 | 00 | GND |
| 1 | 01 | VpClk1 |
| 1 | 10 | VpClk2 |
| 1 | 11 | Vp |

The output programming circuit 101*b* is shown in FIG. 4*b* and includes simple transistor switches 405 by which individual rows of the crossbar arrays desired to be grounded may be selected via input signals active(j).

Preferably signals Load1 and Load2 input to the programming circuit are clock signals with a frequency identical to Clk1 and Clk2. In this case the clock frequency of Clk1, Clk2, Load1, and Load2 should be coordinated with the timing of active(j)=1. As each subsequent row of the crossbar array is desired to be programmed the active(j) value for that particular row should be set to a HIGH logic value while all of the other active(j) values are set to zero so as to present a high resistance output state to the non-programmed rows. In this fashion all 256(16×16) of the addressable points in the crossbar array may be programmed with individual resistances in 16 process steps.

In the embodiment described above the programming voltage Vp is of a magnitude greater than the threshold voltage necessary to alter a property such as resistance of a programmable material used by the crossbar array. While the circuit configurations of FIGS. 4*a* and 4*b* are examples of circuits that may achieve the desired functional outputs of TABLE 1, any other equivalent circuit performing an identical function may be used or a general purpose microprocessor may be employed to achieve the desired output of TABLE 1. While the circuit of FIG. 4 exhibits four control levels using two selection bits (00, 01, 10, 11) for the voltage duration, a larger number of impedance control levels may be attained by using a greater number of bits to select from a larger number of pulse durations and by using larger multiplexers (i.e. 3 bit selection employing an 8 to 1 multiplexer, 4 bit selection employing a 16 to 1 multiplexer, etc.) While a plurality of bits may be used to achieve multiple possible resistance states it is noted that this is not a required feature of the present invention and 1 bit resistance programming (achieving only high or low resistance states) may be achieved by excluding the multiplexers 402 from the circuit of FIG. 4a. In addition, while the programming circuitry used is based on voltage programming (i.e. changing the programmable materials characteristics by applying a constant amplitude voltage pulse) the use of current control circuitry to change the programmable materials characteristics by applying a constant current pulse may in some cases be preferable, depending on the response characteristics of the particular material used. In the programming input circuit, while various pulse widths associated with different clock signals were used to generate impedance changes, the same effect may be achievable via pulse number modulation wherein a different number of pulses of identical pulse width are applied depending on the desired level of impedance change in the programmable material.

IV. Signal Input/Output Circuits

Figure 7A:
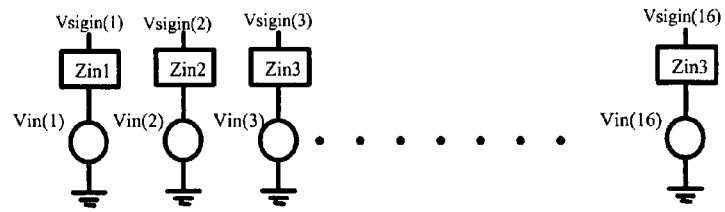
FIGS. 7a-7c illustrates basic circuit configurations for input circuits.
Figure 7B:
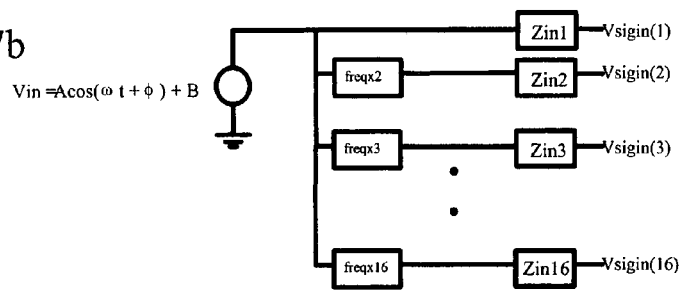

FIG. 7a and FIG. 7b illustrates input signals that may be applied to the crossbar array. The signals may be independent, as in FIG. 7a, or generated from a common signal, as in FIG. 7b, in which harmonics of a sinusoidal wave are generated, or as in FIG. 7c, in which various delays of a rectangular pulse are generated. FIG. 7d illustrates output circuits comprising inverting op-amps. Signals activs(j) (j=1 . . . 16) provide for switching between a high and low impedance state. It is noted that the magnitude of each of the input signals should be less than the voltage necessary to significantly change the resistance of the programmable material so as to assure linear behavior. Each of the input signals includes an input impedance $Zin(i)$ and each of the output op-amps include feedback impedance $Zout(j)$. It is noted that if the input and output circuits were directly connected the output/input relationship developed would be:

$$Vout(1)=-[Zout(1)/Zin(1)]Vin(1),$$

$$Vout(2)=-[Zout(2)/Zin(2)]Vin(2),$$

$$Vout(3)=-[Zout(3)/Zin(3)]Vin(3), \text{ etc.} \quad \text{(Eq4)}$$

These transformations find various uses in signal processing as amplifiers, integrators, differentiators, filters, and various other functions depending on the values of $Zout(j)$ and $Zin(i)$. As will be seen in the following sections using a programmable crossbar array as an intermediate transfer element between the input and output circuits introduces new adaptability and parallel processing capability to such signal processing circuitry.

V. Operation of Crossbar Array

Figure 8A:
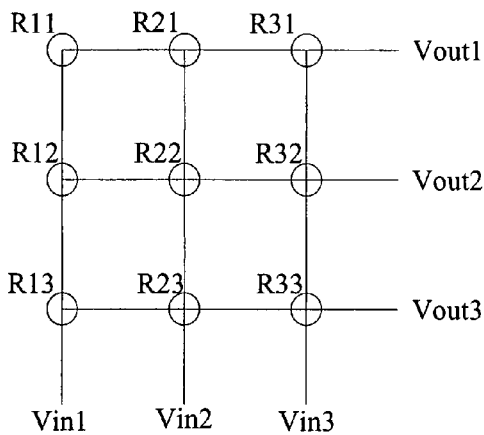
FIG. 8a illustrates a schematic circuit for a 3×3 crossbar array.
Figure 8B:
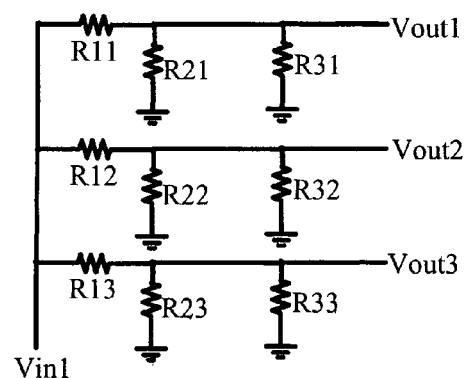
FIG. 8b illustrates a schematic circuit for a 3×3 crossbar array lacking a rectification layer.
Figure 8C:
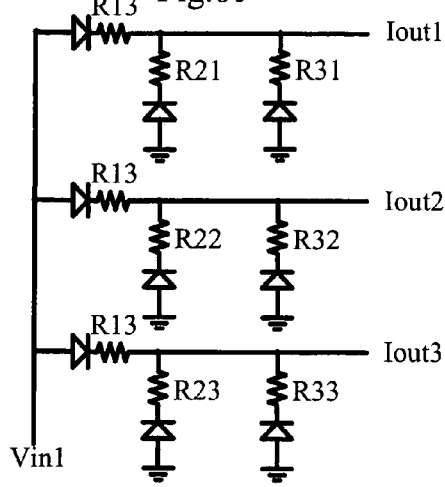
FIG. 8c illustrates a schematic circuit for a 3×3 crossbar array including a rectification layer.
Figure 8D:
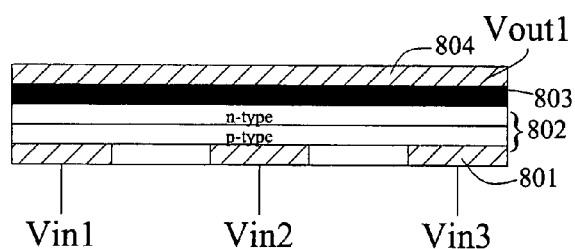
FIG. 8d illustrates a cross-section of a crossbar array including a rectification layer.

FIG. 8a illustrates a 3×3 crossbar array after it has been programmed with a particular resistance pattern. In order to assess the transfer function $T(i,j)$ produced by this resistive network the principle of superposition may be employed in which the effects from each input are independently assessed and added together (this is of course under the assumption that the programmable material has a linear current vs. voltage relationship over the range of voltages that the inputs are applied). Performing this computation yields $$T(1,1)=(R21\|R31)/(R21\|R31+R11)$$

$$T(1,2)=(R22\|R32)/(R22\|R32+R12)$$

$$T(1,3)=(R23\|R33)/(R23\|R33+R13)$$

$$T(2,1)=(R11\|R31)/(R11\|R31+R21)$$

$$T(2,2)=(R12\|R32)/(R12\|R32+R22)$$

$$T(2,3)=(R13\|R33)/(R13\|R33+R23)$$

$$T(3,1)=(R11\|R21)/(R11\|R21+R31)$$

$$T(3,2)=(R12\|R22)/(R12\|R22+R32)$$

$$T(3,3)=(R13\|R23)/(R13\|R23+R33) \quad \text{(Eq5)}$$

wherein $R1\|R2=(R1\times R2)/(R1+R2)$. This is unsatisfactory for the purposes of the present invention because there is not one to one correspondence between the Rij and T(i,j) values. However, by using a crossbar array in which a rectifying layer, such as a pn junction, is included, the transfer function will more adequately reflect the independent programming of the resistance values of the crossbar array. FIG. 8c and FIG. 8d illustrates an example of such a crossbar array in which reference 801 refers to the input wires to the crossbar, reference 802 refers to the rectifying layer, reference 803 refers to a programmable material layer, and reference 804 refers to the output electrodes. The rectifying layer allows current flow only from the input wires to the output wires producing output currents $Iout(j)=\Sigma Vin(i)/Rij$ wherein the summation is performed over all i (for the instant example i=1,2,3). Combining this result with the effects of the input and output impedances (Eq4), and assuming the rectifying layer has a sufficiently low relative value of resistance under the applied currents so as to be approximated by a short when forward biased, the following transfer function elements are calculated $$T(1,1)=-Zout(1)/[Zin(1)+R11]$$

$$T(1,2)=-Zout(2)/[Zin(1)+R12]$$

$$T(1,3)=-Zout(3)/[Zin(1)+R13]$$

$$T(2,1)=-Zout(1)/[Zin(2)+R21]$$

$$T(2,2)=-Zout(2)/[Zin(2)+R22]$$

$$T(2,3)=-Zout(3)/[Zin(2)+R23]$$

$$T(3,1)=-Zout(1)/[Zin(3)+R31]$$

$$T(3,2)=-Zout(2)/[Zin(3)+R32]$$

$$T(3,3)=-Zout(3)/[Zin(3)+R33], \quad \text{(Eq6)}$$

This provides the necessary independent programming of the transfer function based upon programming of the crossbar array resistances (i.e. each value of T(i,j) is uniquely associated with only one corresponding Rij).

Using a crossbar array with intrinsic rectification as described above allows for direct programming of the transfer function characteristics of the crossbar array.

It is noted that the above calculations assume that only the resistance of the programmable material used in the crossbar array is adjustable. However, certain programmable materials may have other impedance characteristics such as a permeability, permittivity, tunneling probability, or dimensional characteristics that may be adjusted by an applied voltage or current source. For a higher degree of generality, the programmable materials linear transfer characteristics at the intersection between two wires in the crossbar array may be expressed as impedance, Zij. Also the wires of the crossbar themselves introduce some parasitic line impedance $Zp(i,j)$. For a crossbar array in which the intersection points between the crossing wires are uniformly spaced and the wires are all formed of the same material with the same diameter, the parasitic line impedance may be calculated as $$Zp(i,j)=[(N-i)+(M-j)]Zp(0)+Zp,\text{res}, \quad (\text{Eq}7)$$

where $Zp(0)$ is the line impedance between two adjacent intersection points, N is the total number of columns of wires, M is the total number of rows of wires, and Zp,res represents residual parasitic impedance resulting from connection wiring between the crossbar array and the input and output circuits. For the example of a 3×3 crossbar array this modifies the transfer function elements (6) to the following form $$T(1,1)=-Zout(1)/[Zin(1)+4Zp(0)+Zp,\text{res}+Z11]$$

$$T(1,2)=-Zout(2)/[Zin(1)+3Zp(0)+Zp,\text{res}+Z12]$$

$$T(1,3)=-Zout(3)/[Zin(1)+2Zp(0)+Zp,\text{res}+Z13]$$

$$T(2,1)=-Zout(1)/[Zin(2)+3Zp(0)+Zp,\text{res}+Z21]$$

$$T(2,2)=-Zout(2)/[Zin(2)+2Zp(0)+Zp,\text{res}+Z22] \quad (\text{Eq}8)$$

$$T(2,3)=-Zout(3)/[Zin(2)+Zp(0)+Zp,\text{res}+Z23]$$

$$T(3,1)=-Zout(1)/[Zin(3)+2Zp(0)+Zp,\text{res}+Z31]$$

$$T(3,2)=-Zout(2)/[Zin(3)+Zp(0)+Zp,\text{res}+Z32]$$

$$T(3,3)=-Zout(3)/[Zin(3)+Zp,\text{res}+Z33]$$

The parasitic resistances may be small enough to be ignored when the wiring of the crossbar includes high conductivity material with a sufficiently large cross sectional area. However, this may not be a practical approximation in the case of nanowire crossbar arrays in which the parasitic resistance may become significant in comparison to the impedances of the programmable material. In this case in order to minimize the variation generated by different parasitic resistance values the basic line impedance $Zp(0)$ may be determined and the input impedances Zin set to $Zin(1)=Zin'(1)+Zp(0)$, $Zin(2)=Zin'(2)+2Zp(0)$, and $Zin(3)=Zin'(3)+3Zp(0)$. This simplifies the crossbar transform $T(i,j)$ to $$\begin{aligned}
T(1,1) &= -Zout(1)/[Zin'(1)+5Zp(0)+Zp,\text{res}+Z11] \\
&= -Zout(1)/[Zin'(1)+Z11+Zc1]
\end{aligned} \quad (\text{Eq }9)$$

$$\begin{aligned}
T(1,2) &= -Zout(2)/[Zin'(1)+4Zp(0)+Zp,\text{res}+Z12] \\
&= -Zout(2)/[Zin'(1)+Z12+Zc2]
\end{aligned}$$

$$\begin{aligned}
T(1,3) &= -Zout(3)/[Zin'(1)+3Zp(0)+Zp,\text{res}+Z13] \\
&= -Zout(3)/[Zin'(1)+Z13+Zc3]
\end{aligned}$$

-continued $$\begin{aligned}
T(2,1) &= -Zout(1)/[Zin'(2)+5Zp(0)+Zp,\text{res}+Z21] \\
&= -Zout(1)/[Zin'(2)+Z21+Zc1]
\end{aligned}$$

$$\begin{aligned}
T(2,2) &= -Zout(2)/[Zin'(2)+4Zp(0)+Zp,\text{res}+Z22] \\
&= -Zout(2)/[Zin'(2)+Z22+Zc2]
\end{aligned}$$

$$\begin{aligned}
T(2,3) &= -Zout(3)/[Zin'(2)+3Zp(0)+Zp,\text{res}+Z23] \\
&= -Zout(3)/[Zin'(2)+Z23+Zc3]
\end{aligned}$$

$$\begin{aligned}
T(3,1) &= -Zout(1)/[Zin'(3)+5Zp(0)+Zp,\text{res}+Z31] \\
&= -Zout(1)/[Zin'(3)+Z31+Zc1]
\end{aligned}$$

$$\begin{aligned}
T(3,2) &= -Zout(2)/[Zin'(3)+4Zp(0)+Zp,\text{res}+Z32] \\
&= -Zout(2)/[Zin'(3)+Z32+Zc2]
\end{aligned}$$

$$\begin{aligned}
T(3,3) &= -Zout(3)/[Zin'(3)+3Zp(0)+Zp,\text{res}+Z33] \\
&= -Zout(3)/[Zin'(3)+Z33+Zc3]
\end{aligned}$$

where $Zc1=5Zp(0)+Zp,\text{res}$, $Zc2=4Zp(0)+Zp,\text{res}$, and $Zc3=3Zp(0)+Zp,\text{res}$.

In general for an arbitrarily large crossbar array $$T(i,j)=-Zout(j)/[Zin'(i)+Zij+Zcj] \quad (\text{Eq}10)$$

And $$Vout(j)=\Sigma T(i,j) \times Vin(i), \text{ the summation performed for all } i. \quad (\text{Eq}11)$$

Figure 9:
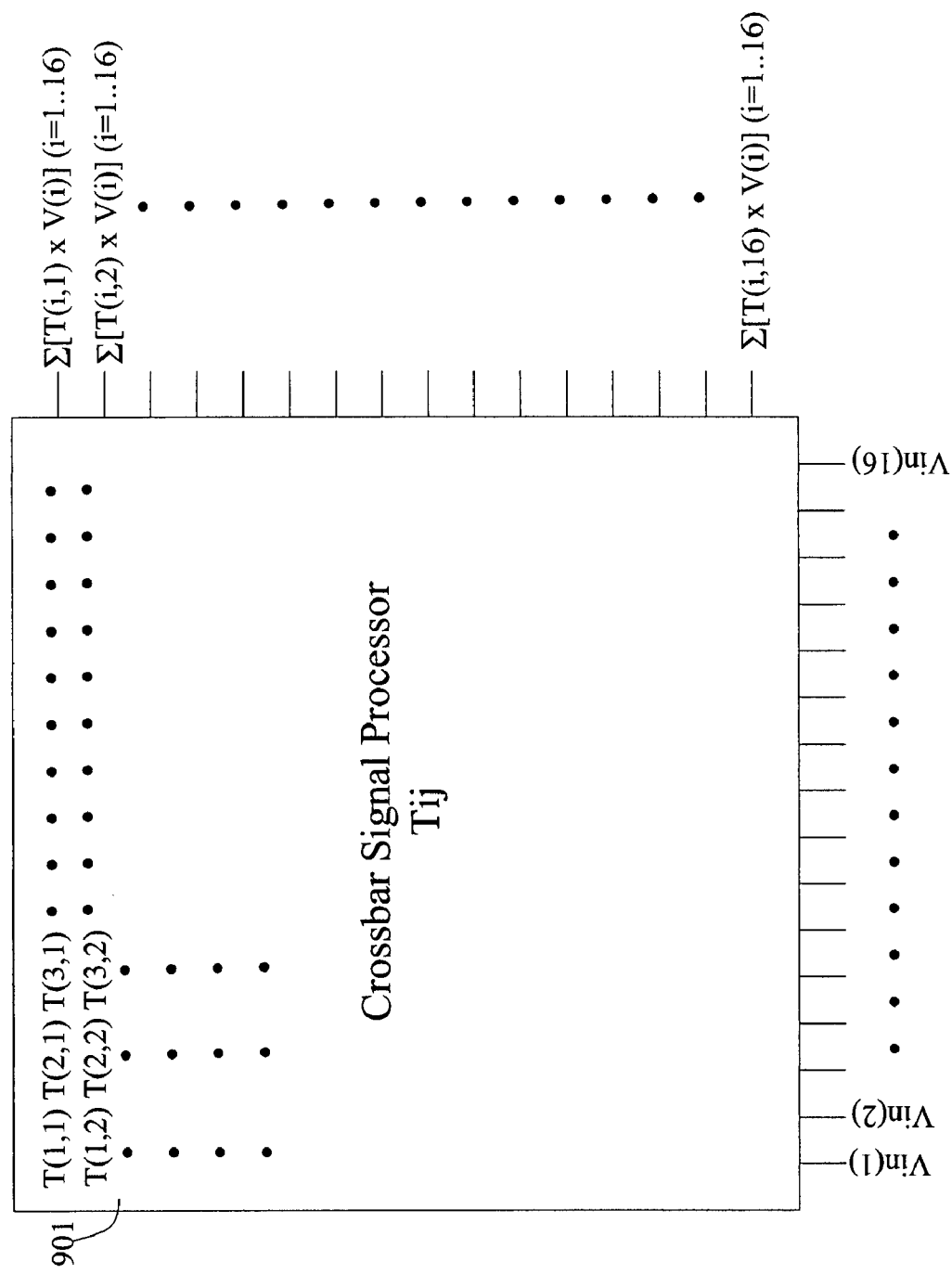
FIG. 9 illustrates the complete behavior of the crossbar array in combination with the input and output circuits.

FIG. 9 illustrates the overall operational behavior of the programmed crossbar array combined with the input and output circuitry of FIG. 1. The combination of the circuit elements 101a, 101b, 102a, 102b, 103a, 103b, and 110 may be formed as a single application specific integrated circuit (ASIC) or as plural circuit elements connected together by external wiring. In either case the overall circuitry configuration is referenced as Crossbar Signal Processor 901 with the set of input signals Vin(i) transformed into a set of output signals whose values depend on the programming state of the crossbar array.

VI. Applications of Crossbar Signal Processor in Waveform Generation, Control Systems, and Signal Filtering.

One of the more obvious applications of the above described signal processing crossbar array is in waveform generation. The mathematical techniques of Fourier analysis shows that periodic signals may be decomposed into linear combinations of elementary sine and/or cosine functions and their harmonics (i.e. frequency multiples). Using the signal input of FIG. 7b, setting Zin'(1), Zin'(2), . . . ,Zout(1), Zout(2), etc. all to a common resistance value R, and assuming the cumulative parasitic resistances Zcj are relatively small compared to R, the crossbar transform produces:

$$Vout(j)=-\Sigma 1/(1+Zij/R)\ [A\cos(i\omega t+\phi)+B], \text{ the summation performed for } 1\leq i \leq 16. \quad (\text{Eq}12)$$

It is noted that B is necessary as a sufficient dc bias (at least A/2) to assure that the signals pass through the rectification layer (802, FIG. 8d) without being partially rectified. However, in certain cases where clipped or rectified output waveforms are desired B may be set to a value less than A/2. Depending on the desired application, signals Vout(j) may be further processed by means such as phase inverters, filters, etc. or any of the various other means known to one of ordinary skill in the waveform shaping art to provide a desired output to target loads.

While harmonic sinusoidal functions are one example of a set of basis functions that may be used to generate a plurality of output waveforms other orthogonal waveform basis may be used as known from the mathematical discipline of orthogonal function theory. For example harmonics of a periodic rectangular wave may be used as a basis to generate stepped waveforms that may be useful in motor control or other applications that require a plurality of different dc voltage levels to be applied during a periodic interval.

Figure 7C:
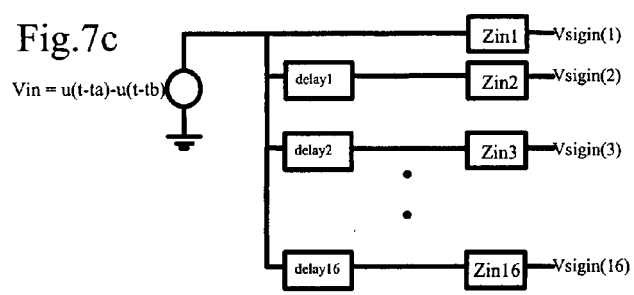
Figure 7D:
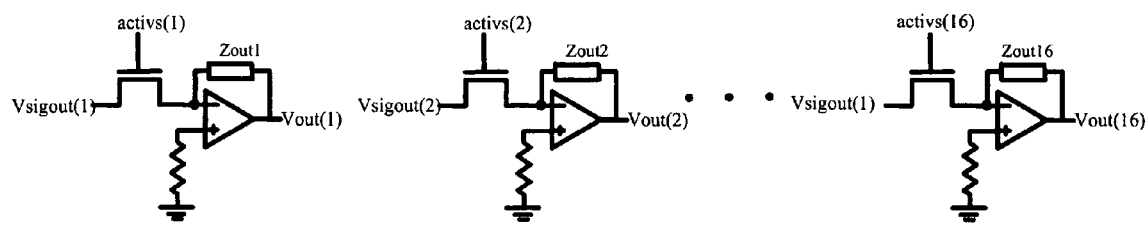
FIG. 7d illustrates a basic circuit configuration for an output circuit.

In addition to harmonics of periodic functions, stepped delays may be used as the inputs Vin(i) as in FIG. 7c in which the input is a pulse starting at time ta and ending at time tb. Setting Zin'(1), Zin'(2), . . . ,Zout(1), Zout(2),etc. all to a common resistance value R, and assuming the cumulative parasitic resistances Zcj are relatively small compared to R, the crossbar transform produces:

$$Vout(j) = -\Sigma 1/(1+Zij/R)[u(t-ta-i\Delta t)-u(t-tb-i\Delta t)], \text{ the summation performed for } 1 \leq i \leq 16. \quad (Eq13)$$

Where u(t) is 1 for t>0 and 0 otherwise and $\Delta t$ is the basic unit of the time delay.

FIG. 10a displays an example of the operation of the crossbar transformation when the signal inputs are rectangular waves with various periods set to be multiples of a base period T. The crossbar transform is programmed such that Zij<<R for ij=(1,1),(2,1),(3,1),(3,2); Zij=R for ij=(1,2); and Zij>>R for all other (i,j). This particular programming of the crossbar array generates two outputs Vout1 and Vout2, as shown in FIG. 10a.

FIG. 10b displays an example of the operation of the crossbar transformation when the signal inputs are pulses with various degrees of time delay applied. Under the same crossbar programming state as the previous example the output waveforms Vout1 and Vout2 take the forms shown in FIG. 10b.

As can be seen from the above examples a programmable crossbar array, such as that of the present invention, may be employed to provide a source of programmable waveforms or pulses based upon an input of basic waveforms and the programmed state of the crossbar array. Such waveforms maybe applicable to motor control systems, signal control systems, and a variety of other applications requiring versatility in the control of the types of waveforms required in a specified application.

For applications arising from control systems and signal filtering Zin(i) and Zout(j) may be formed from a combination of resistive, capacitive, inductive or other impedance elements. Using the Laplace domain representation impedances Zin(i) and Zout(j) may be of the form Zin(i,s)=Rin(1+ain(i)s)/(1+bin(i)s) and Zout(j,s)=Rout(1+aout(j)s)/(1+bout(j)s) where ain(i), bin(i), aout(j), bout(j), Rin, and Rout are constants determined by the type, value, and configuration of impedance elements used in Zin(i) and Zout(j). Using these impedance values in (11) produces:

$$Vout(j,s) = -\Sigma[Rout(1+aout(j)s)(1+bin(i)s)]/[Rin(1+ain(i)s)(1+bout(j)s)+(Zij+Zcj)(1+bin(i)s)(1+bout(j)s)] \times Vin(i,s), \quad (Eq14)$$

the summation performed for $1 \leq i \leq 16$.

One particular implementation of (Eq14) may be employed in which the input voltages are connected to a common source Vin(s) and all bin(i), bout(j) are set to zero producing the outputs:

$$Vout(j,s) = -Vin(s)(Rout/Rin)\Sigma[(1+aout(j)s)]/[(1+ain(i)s)+(Zij+Zcj)/Rin], \quad (Eq15)$$

the summation performed for $1 \leq i \leq 16$.

Depending on the relative values of the parameters aout(j), ain(i), and Zij, outputs of the form $$Vout(j,s) = -Vin(s)(Rout/Rin)[A(s,Z11)+B(s,Z21)+C(s,Z31)+ \ldots] \quad (Eq16)$$

may be produced, where A(s,Z11), B(s,Z21), C(s,Z31), etc. are transfer functions whose characteristics depend on the respective programmed values Z11, Z21, Z31, etc. Transfer functions of the form (s+a)/(s+b) where b>>a have a transfer characteristic of a high pass filter. Transfer functions of the form (s+a)/(s+b) where b<<a have a transfer characteristic of a low pass filter. Combining a plurality of these transfer functions as in (14) and (15) may produce a variety of high pass, low pass, bandpass, stopband, or other filter configurations depending on the programmed states Zij. For digital systems a similar analysis in terms of the z-transform may be performed.

It is noted that, in addition to use in signal filters, operation of control systems used in robotic control, motor control, servo-regulation systems, etc. may benefit from the programmable crossbar array transfer function of the present invention. In so far as a particular control system may need to be adjusted depending on a temperature sensor, pressure sensor, humidity sensor, visual sensors, audio sensors, vibration sensor, chemical sensors, etc. the programmed states Zij of the crossbar array may be reprogrammed, as described in the next section, depending on one or more of the above mentioned sensors.

VII. Reprogramming of Crossbar Signal Processor

Unless the programming voltage may be the same polarity as the input voltage (as in the programmable resistive material of Campbell et al. U.S. Pat. No. 6,867,996) the crossbar signal processor as described in the previous sections only allows for a one time programming since typically a reversal of the material programming requires application of a voltage or current of opposite polarity. For example, if the programmable material is a doped conductive polymer as described by Nagasubramanian et al. U.S. Pat. No. 5,272,359, application of a sufficient positive voltage decreases the materials resistance while application of a sufficient negative voltage increases the resistance. However, the use of rectification layer 802 (FIG. 8d) eliminates the ability of applying a reversal voltage in the previous embodiment. In addition a variety of desirable programmable materials may be initially programmable by a negative polarity voltage or current instead of a positive voltage or current. It would be highly desirable to the waveform generation, control systems, and digital filtering applications, as well as in applications in communications and pattern recognition, for the crossbar values Zij to be reprogrammable so that the operation of these various devices may be selectively changed.

Figure 11A:
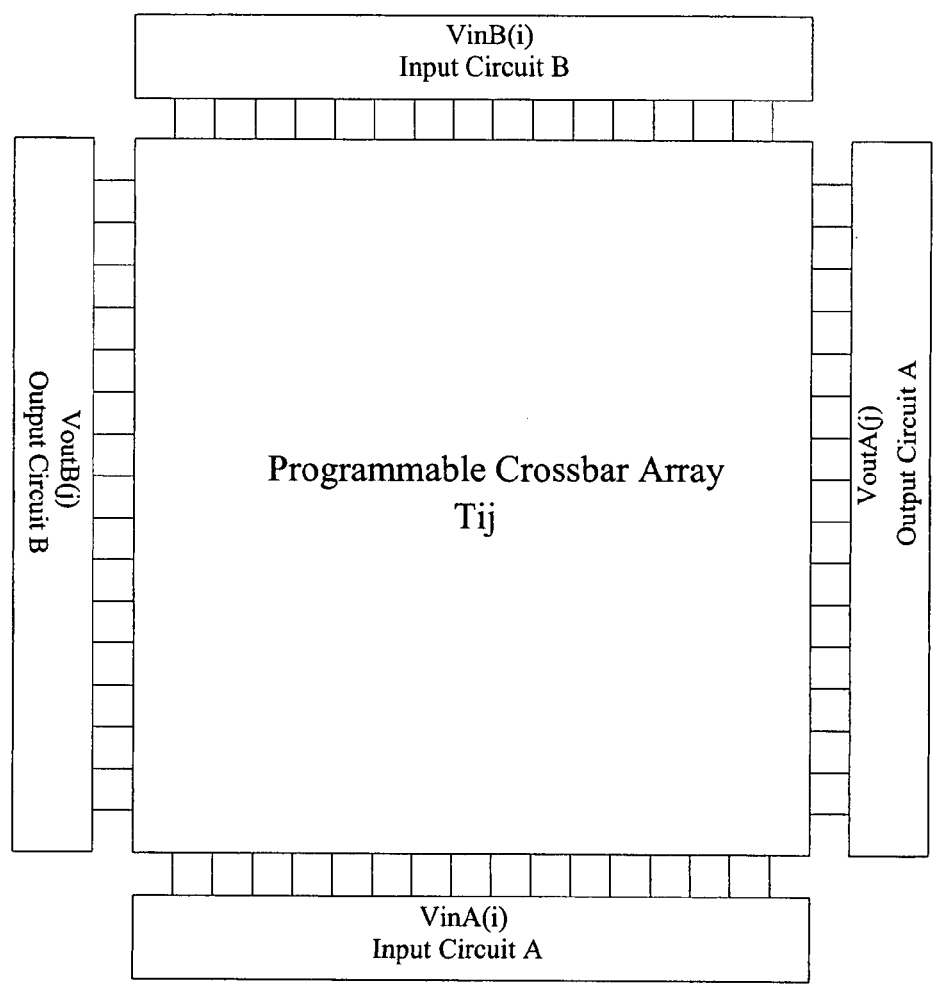
FIG. 11a illustrates a first circuit configuration for a reprogrammable crossbar signal processing unit.

In order to provide reprogramming of the crossbar signal processor a modified embodiment of the crossbar signal processor of FIG. 1 may be provided as shown in FIG. 11a. Input Circuit A and Input Circuit B are identical and are each formed with corresponding programming circuitry 101a, signal input circuitry 102a, and selection circuitry 103a, as previously described. Output Circuit A and Output Circuit B are also identical and are each formed with corresponding programming circuitry 101b, signal output circuitry 102b, and selection circuitry 103b. Under normal operation, and in order to reduce interference between the circuitry in groups A and B, when Input Circuit A and Output Circuit A are operational, Input Circuit B and Output Circuit B may be set to a non-operational state by setting Input Circuit B and Output Circuit B to the program state (selout=1, FIG. 3) and by setting the active(j) inputs to 0 (FIG. 4b). When Input Circuit B and Output Circuit B are desired to be operational, Input Circuit A and Output Circuit A may similarly be set to a non-operative state. Also each of the respective circuit groups A and B may be provided with independent grounds.

Figure 11B:
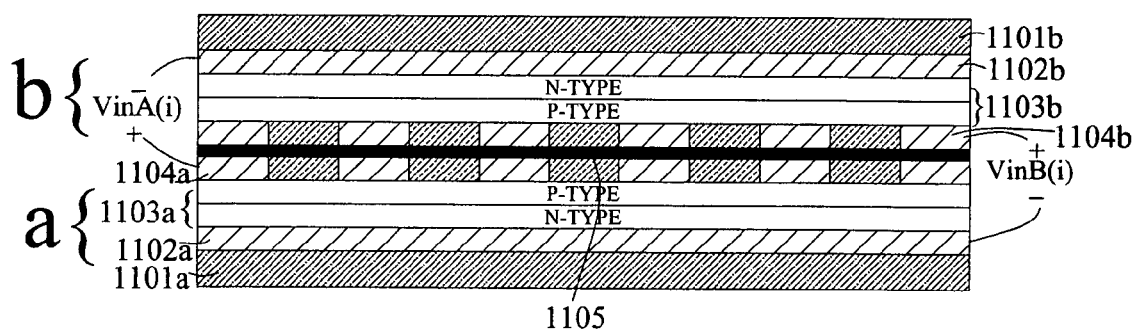

The cross-sectional structure of the Programmable Crossbar Array of FIG. 11a is illustrated in FIG. 11b. As shown, two symmetrical crossbar sections a,b are formed, each comprising corresponding insulating support substrates 1101a, 1101b, first arrays of parallel conductive wires 1102a, 1102b, rectification layers 1103a, 1103b (shown as a pn junction for exemplary purposes but with other rectification materials or rectifying molecular junctions being equivalent), and second arrays of parallel conductive wires 1104a, 1104b formed perpendicularly to wires 1102a, 1102b. The two sections a and b may be made integrally via micro or nanofabrication procedures or made separately and combined so as to sandwich a programmable material layer or molecular film 1105. Layer 1105 should be formed so as to be sufficiently thin relative to the wire interspacing distance so as to avoid leakage current between adjacent wires within layer 1104a or layer 1104b. To further avoid such leakage current, anisotropic material layers with high conductivity in the direction perpendicular to the plane formed by layer 1105 but with low conductivity in the direction parallel to the plane formed by layer 1105 may be added above and below layer 1105. Also, instead of a continuous layer, layer 1105 may be segmented into electrically isolated portions, each portion associated with one of the intersection point of the crossbars.

In order to achieve proper alignment in the case that the sections a and b are formed separately, material 1105 may be provided at an initially low resistance state and a potential difference may be applied between wires 1104a and 1104b. Using a piezoelectric or other ultrafine positioning device the two sections a,b may be scanned relative to one another in a direction perpendicular to the orientation of wires 1104a and 1104b. The point of minimum resistance may be identified in this manner and should correspond to closest contact between the wires. At this point the sections may be bonded together by conventional techniques. It is noted that for sufficiently high density wiring arrays the effective region of the potential generated by individual wires may be large enough to tolerate some misalignment. If it is the desire to simply return material 1105 to its non-programmed state precise alignment may not be necessary. It is also conceivable simply to provide continuous conductive surfaces instead of an array of wires for layers 1102a and 1104b. While this would eliminate the ability for selective addressing of individual crosspoints of the crossbar, if all that is desired is simultaneous reversal of all of the programmed states (i.e. returning all Zij of the crossbar to a common state) individual wires would not be necessary and the Input/Output Circuits B may be greatly simplified.

Due to the rectification layers 1203a, 1203b the resulting structure allows current flow from wiring 1204a to 1202b only when wiring 1204a is sufficiently positively biased with respect to wiring 1202b and allows current flow from wiring 1204b to 1202a only when wiring 1204b is sufficiently positively biased with respect to wiring 1202a. Thus the material/molecular film 1205 may be selectively programmed via the paths from 1204a to 1202b by Input/Output Circuits A and selectively deprogrammed via the paths from 1204b to 1202a by Input/Output Circuits B. It is emphasized that during programming or deprogramming the non-operational circuit combination should be set to a relatively high resistance state to avoid current leakage from 1204a to 1202a or from 1204b to 1202b. The deprogramming may be accomplished simultaneously on all crosspoints of the crossbar array by setting all of the connections 1202a to ground and setting all of the connections 1204b to a voltage high enough to reverse the programming state, thus clearing the previously programmed state. Alternatively, each crosspoint may be independently reprogrammed via the programming circuitry of Input/Output Circuits B.

Figure 12A:
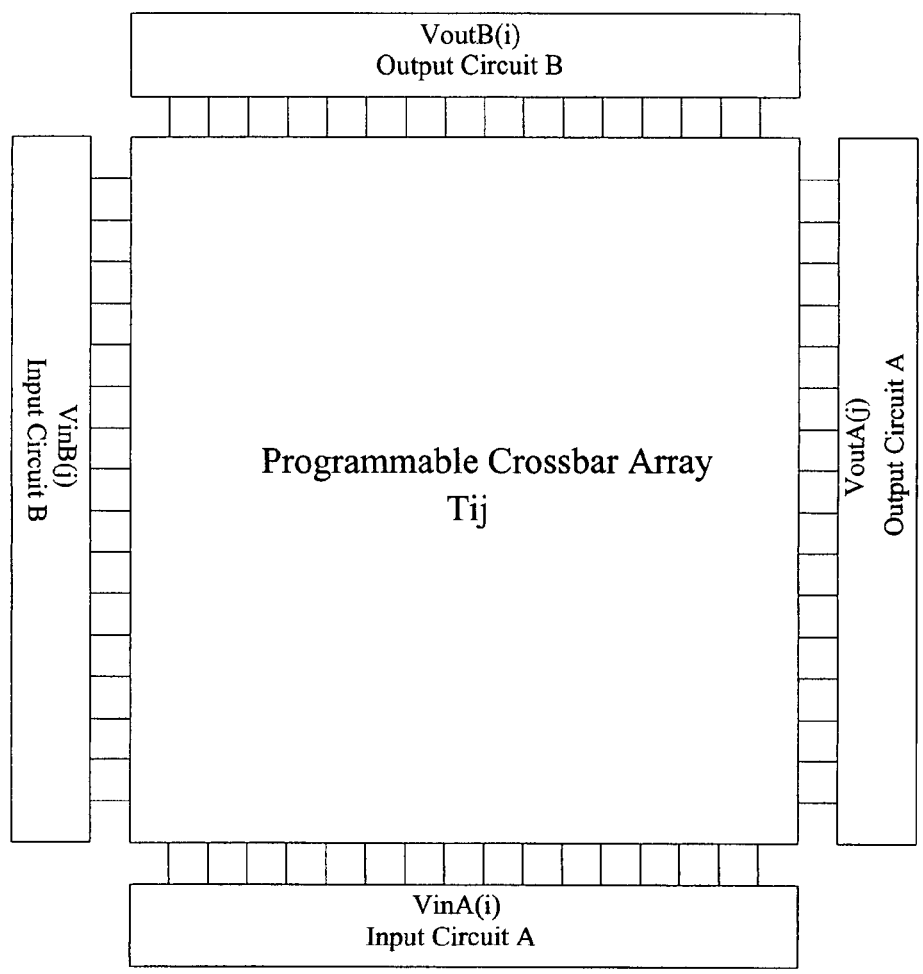
FIG. 12a illustrates a second circuit configuration for a reprogrammable crossbar signal processing unit.

FIG. 12a shows another embodiment of the crossbar signal processor in which the respective Input Circuits A and B are orthogonally oriented.

Figure 12B:
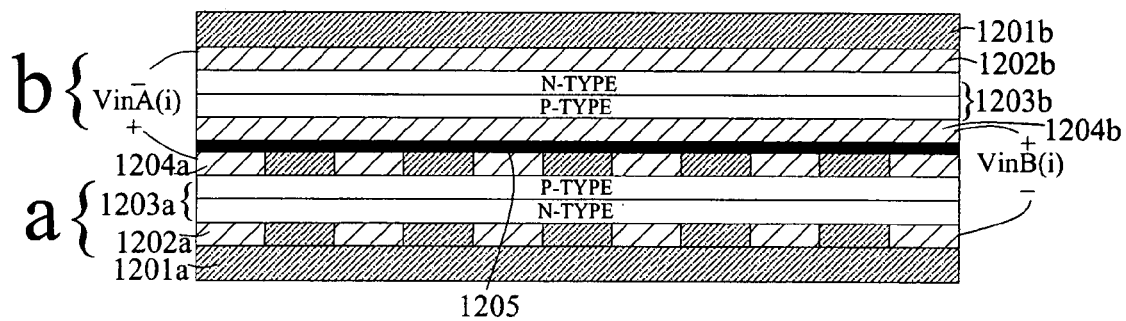

The cross-sectional structure of the Programmable Crossbar Array of FIG. 12a is illustrated in FIG. 12b. As shown, two anti-symmetrical crossbar sections a,b are formed each comprising corresponding insulating support substrates 1201a, 1201b, first arrays of parallel conductive wires 1202a, 1202b, rectification layers 1203a, 1203b (shown as a pn junction for exemplary purposes but with other rectification materials or rectifying molecular junctions being equivalent), and second arrays of parallel conductive wires 1204a, 1204b respectively formed parallel to wires 1202a, 1202b. The two sections a and b may be made integrally via micro or nanofabrication procedures or made separately and combined so as to sandwich a programmable material or molecular film 1205. Layer 1205 should be formed so as to be sufficiently thin relative to the wire interspacing distance so as to avoid leakage current between adjacent wires within layer 1204a or layer 1204b. To further avoid such leakage current, anisotropic material layers with high conductivity in the direction perpendicular to the plane formed by layer 1205 but low conductivity in the direction parallel to the plane formed by layer 1205 may be added above and below layer 1205. Also, instead of a continuous layer, layer 1205 may be segmented into electrically isolated portions, each portion associated with one of the intersection point of the crossbars.

It is noted that Input/Output Circuits B have been taught to include programming circuits 101a/101b, signal input/output circuits 102a/102b and selection circuitry 103a/103b. It is conceivable to only provide programming circuits 101a/101b as Input/Output Circuits B when only reprogramming capability is desired. However, the advantage of having a larger number of possible input/output combinations per given circuit area may favor inclusion of the signal input/output and selection circuitry in many cases.

It is noted that the structure of the crossbar arrays as shown in FIG. 12a and 12b may also be usefully applied to other applications than signal processing. For example, memory storage applications using the crossbar array structure of FIGS. 11b and 12b would allow for parallelism in reading and writing data to the crossbar array.

Thus given the above description, the crossbar signal processor provides a versatile reprogrammable instrument for waveform generation, control systems, and signal filtering. It is noted that it is even possible for a single crossbar signal processor to switch between one type of system such as waveform generation and another type of system such as a signal filter by reprogramming the crossbar Zij values and appropriately selecting the input signals. Fine control of the Zij values may also compensate for resistance variation caused by external environmental effects such as temperature. Thus reprogrammable crossbar signal processors are seen to have significant advantages over hardwired systems which are functionally limited by the specific circuitry used.

VIII. Signal Modulation Using Crossbar and Applications in Communications

It was noted in the last section that interference generated by simultaneous operation of both Input/Output Circuit group A and Input/Output Circuit group B may be avoided by setting the non-operational group to a high impedance state. However, some advantageous applications may be developed based on simultaneous signal transmission.

Figure 13A:
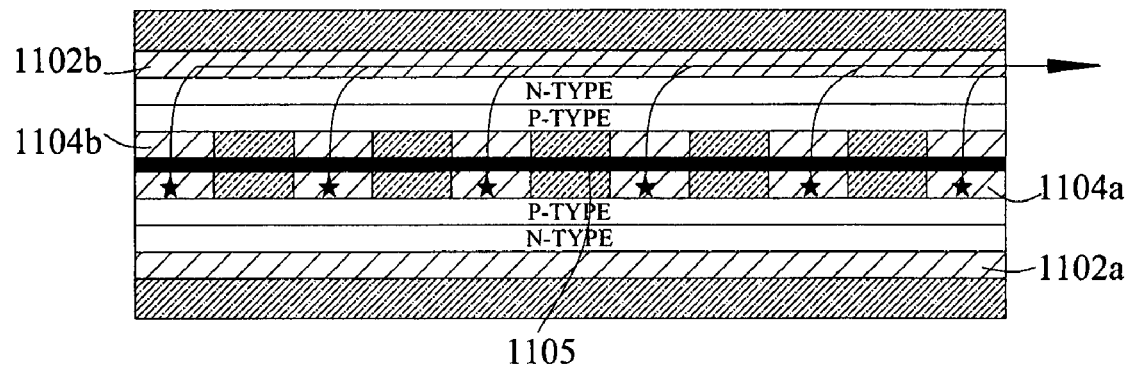
FIGS. 13a and 13b illustrates current flows generated by input voltages applied to a reprogrammable crossbar array.
Figure 13B:
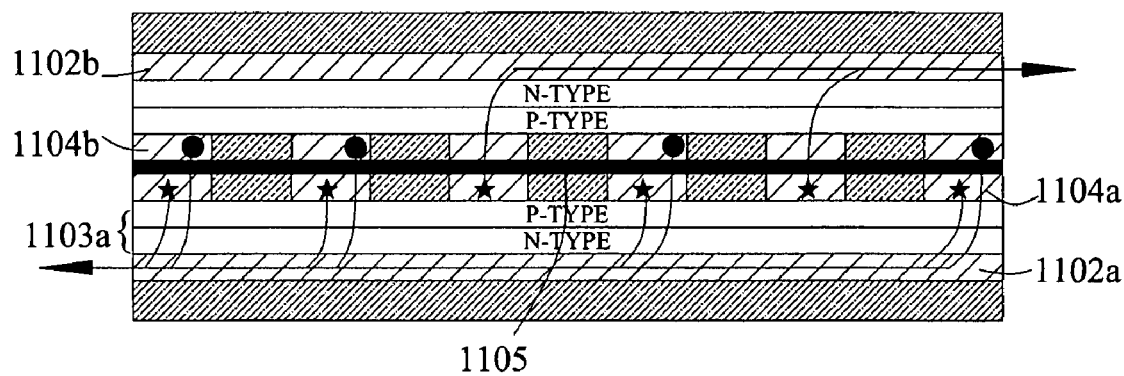
Figure 13C:
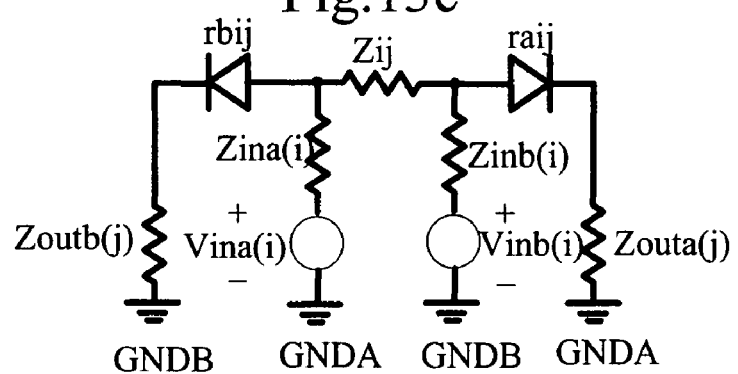
FIG. 13c illustrates a schematic representation of a circuit formed by the reprogrammable crossbar processor.

FIG. 13a shows the conventional current flow direction of the crossbar of FIG. 11b from conductive wiring 1104a to 1102b for the case of all signal inputs of Input/Output Circuit group B being set to a high impedance state. However, when some of the inputs in Input/Output Circuit group B are activated the direction of current flow is determined by the polarity of the voltage across the layer 1105 as shown in FIG. 13b. FIG. 13c shows an approximated schematic diagram of the overall circuit configuration with Zina(i) and Zinb(i) representing the overall input impedances for the ith column of the crossbar array, Zouta(j) representing the overall output impedances of the jth row, Zij representing the programmed impedance state of the crossbar array at the intersection of the ith column and jth row, GNDA and GNDB representing independent, physically isolated grounds, and raij and rbij representing the states of the rectification layers at the ith column and jth row. When Zina(i)=Zinb(i) and Zouta(j)=Zoutb(j) the relative values of Vina(i) and Vinb(i) determine whether or not conduction occurs via one of the rectification layers. In this case, when Vina(i) is sufficiently greater than Vinb(i) current will flow across Zij from left to right and raij will be conducting while rbij is non-conducting. When Vinb(i) is sufficiently greater than Vina(i) current will flow across Zij from right to left and rbij will be conducting while raij is non-conducting. When Vinb(i) is close in value to Vina(i) both raij and rbij are non-conducting. The following table summarizes the possible states.

TABLE 2

| | Raij | rbij |
|---|---|---|
| Vina(i) ≧ Vinb(i) + $V_T$ij | Conducting | non-conducting |
| Vinb(i) ≧ Vina(i) + $V_T$ij | Non-conducting | Conducting |
| \|Vina(i) − Vinb(i)\| < $V_T$ij | Non-conducting | non-conducting |

$V_T$ij represents a threshold voltage at which conduction from the rectification layers starts to become significant and is determined by Zij as well as the material properties and dimensions (doping concentration, thickness, etc.) of the rectification layers. It is conceivable to apply direct modulation of Zij using sufficiently large voltage differentials. However, for purposes of the present embodiment, the magnitude of Vina(i)−Vinb(i) should be chosen so as not to result in alteration of the programmable material's impedance, Zij. In practice, the magnitude of Vina(i)−Vinb(i) may actually be larger than the programming voltages without causing a modification in Zij because the input and output impedances Zin(i) and Zout(j), which attenuate the differential voltage Vina(i)−Vinb(i), are not present in the programming circuitry.

Figure 16:
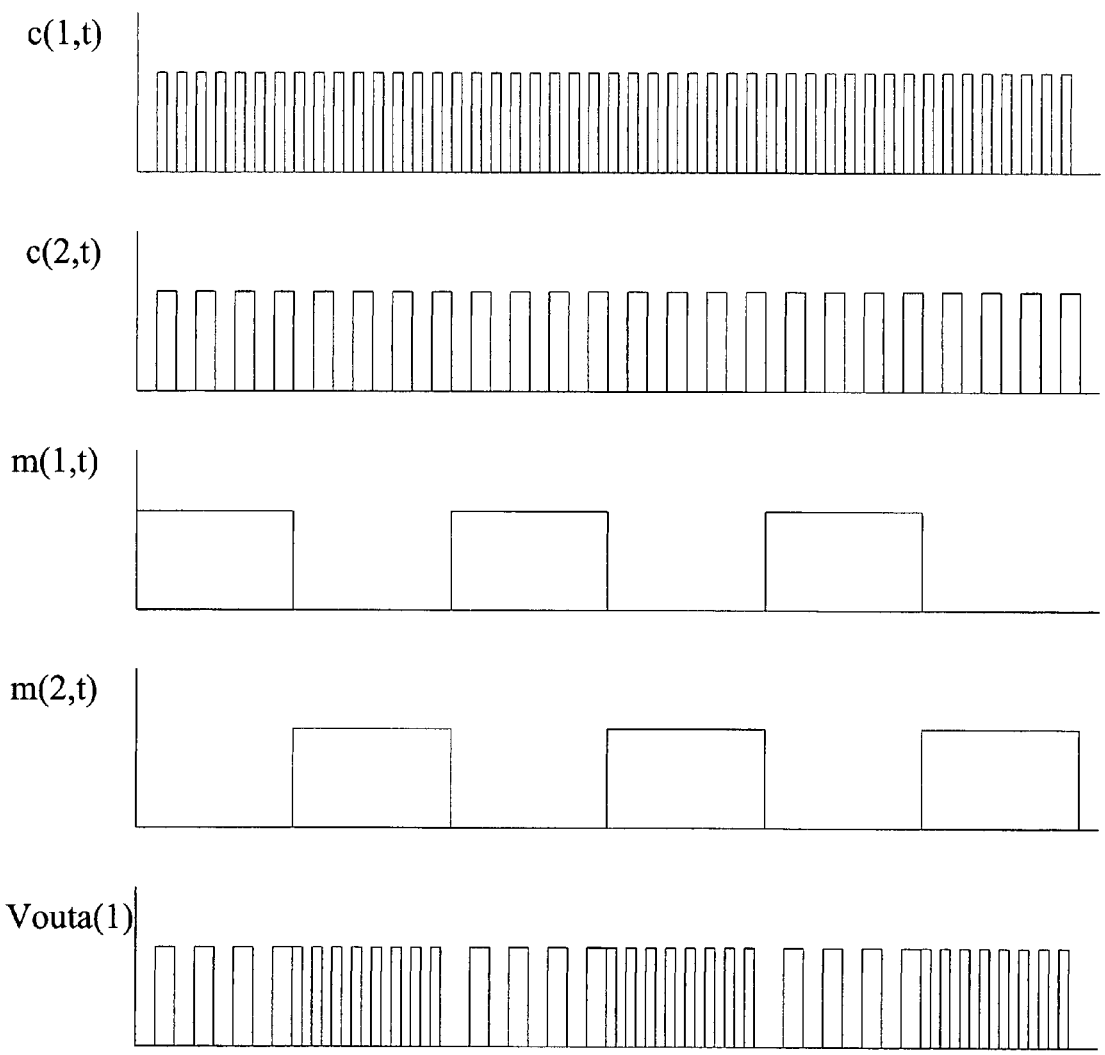

FIGS. 14-16 show examples of the use of the crossbar signal processor of FIGS. 11a and 11b in signal modulation.

In FIG. 14, Vina(i) represents a carrier signal having a given magnitude while Vinb(i) represents a message signal with the same magnitude. Given Table 2 the outputs Vouta(j) and Voutb(j) shown in FIG. 14 should be generated based on the inputs. In this case the output waveforms may be expressed symbolically as $$Vouta(j)=Vina(i)*!(Vinb(i))  \qquad (Eq17a)$$

$$Voutb(j)=Vina(i)*Vinb(i)  \qquad (Eq17B)$$

where ! represents the logical NOT operation and * represents the logical AND operation. Considering all of the inputs and outputs of the crossbar array and the transfer characteristics of the crossbar array (Tij, Eq.10 and Eq.11), the output may be expressed in a more analytically useful form as $$Vouta(j)=\Sigma Tij\ [Vmaxa(i)-Vinb(i)]\delta(Vina(i),Vinb(i))+V_Tij), \text{ the summation performed for } 1\leq i \leq 16. \qquad (Eq18a)$$

$$Voutb(j)=\Sigma Tij[Vinb(i)-Vmina(i)]\delta(Vinb(i),Vina(i))+V_Tij), \text{ the summation performed for } 1\leq i \leq 16. \qquad (Eq18b)$$

where Vmaxa(i) is the peak amplitude of Vinb(i), Vmina(i) is the minimum amplitude of Vina(i), and δ(x,y) is 0 if x≦y and 1 otherwise.

Figure 17:
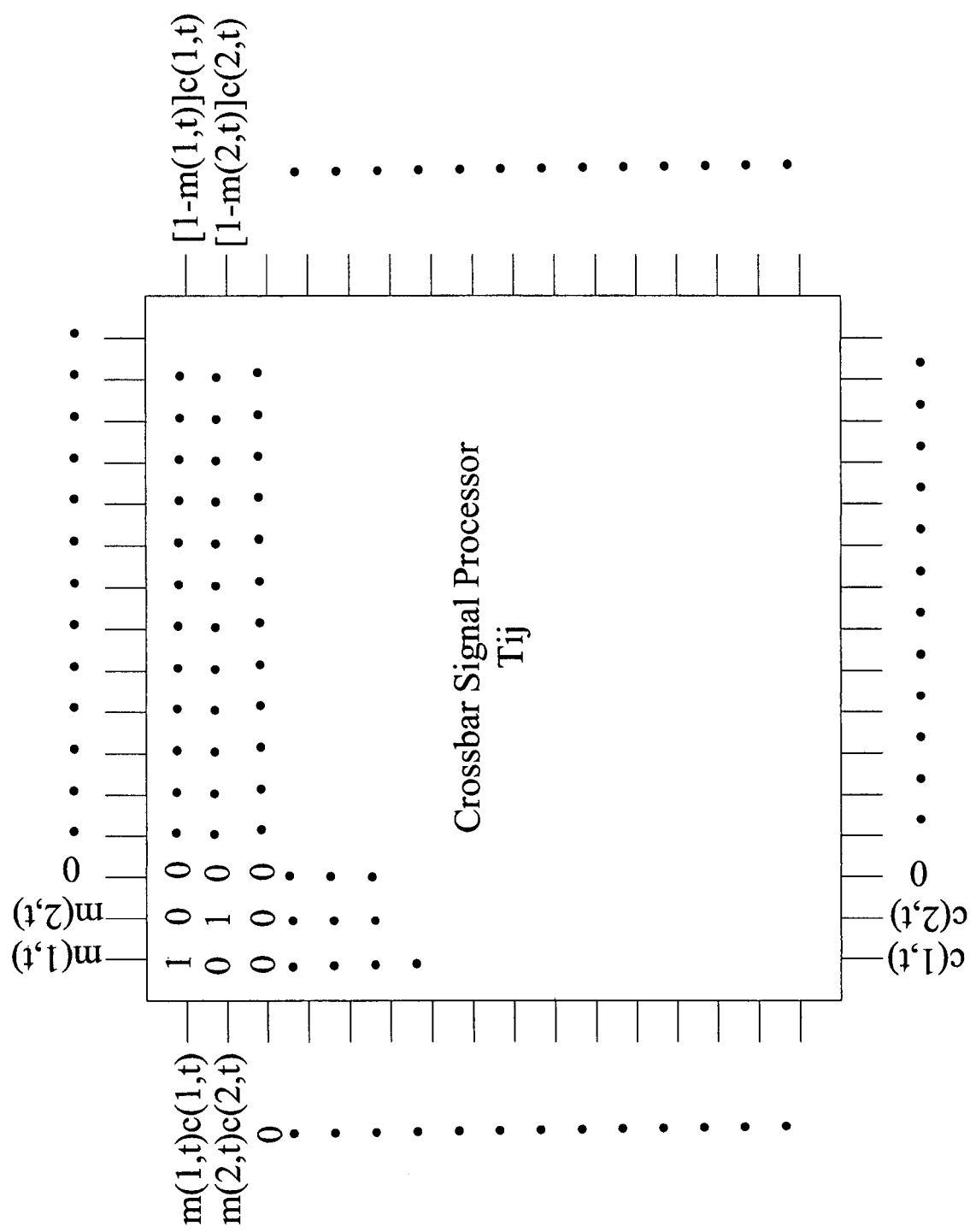
FIGS. 17 and 18 illustrates implementations of the reprogrammable crossbar processor of FIGS. 11a and 11b in signal modulation.

The output response of FIG. 14 demonstrates an example of pulse number modulation. The pulse widths input as signals Vinb(i) may be generated based on audio, video, data, or other signals and the output signals may be transmitted by radio or other electromagnetic wave transmission, fiber optic transmission, or any other information transmission technique. Taking the example of a 16×16 crossbar array, 16 different message signals may be transmitted onto 16 different carrier waves using the crossbar signal processor. In another embodiment all 16 inputs Vinb(i) of the crossbar array may be connected to a common message signal source and transmitted onto 16 different carrier waves. Alteration of the Tij values may be performed by reprogramming of the Zij values thus enabling one to selectively switch which message signal is associated with which carrier signal for a particular output channel. FIG. 17 illustrates one implementation in which Tij is programmed such that for i=j the impedance value Zij is set to a relatively low value and for i≠j Zij is set to a relatively high value. In the figure, Vina(i)=time dependent carrier signals c(i,t), Vinb(i)=time dependent message signals m(i,t), and the peak values of the message and carrier signals is normalized to one (Vmaxa(i)=1). For a particular crossbar signal processor implementation the impedances Zout(j) may be chosen such that Zout(j)=Zin'(i)+Zcj, and inverting circuitry may be added on all of the outputs which reduces Eq. 10 to $$T(i,j)=1/[1+Zij/(Zin'(i)+Zcj)]. \qquad (Eq19)$$

Thus for Zij<<Zin'(i)+Zcj, T(i,j) approaches a value of 1 and for Zij>>Zin'(i)+Zcj, T(i,j) approaches a value of zero. It is noted that, given a particular programmable material with a range of impedances, Zin'(i)+Zcj may optimally be set at the median value of the programmable materials range of values.

FIG. 15 is similar to that of FIG. 14 except that the message signal has a variation in amplitude instead of pulse width. This may be used so as to generate amplitude modulation. As in the previous case, the message signals m(i,t) may be generated based on audio, video, data, or other signals and the output signals may be transmitted by radio or other electromagnetic wave transmission, fiber optic transmission, or any other transmission technique.

FIG. 16 displays the waveforms used in a frequency modulation technique with the crossbar signal processor setup as shown in FIG. 17. Signals c(1,t) and c(2,t) are carrier signals fixed at two different frequencies. The message signals m(1,t) and m(2,t) are mutually exclusive signals with m(2,t) being off when m(1,t) is on. The pulse widths of m(1,t) and m(2,t) determines which of the carrier signals (i.e. which frequency) is transmitted at any given time. As in the previous cases, the message signals m(i,t) may be generated based on audio, video, data, or other signals and the output signals may be transmitted by radio or other electromagnetic wave transmission, fiber optic transmission, or any other transmission technique.

Figure 18:
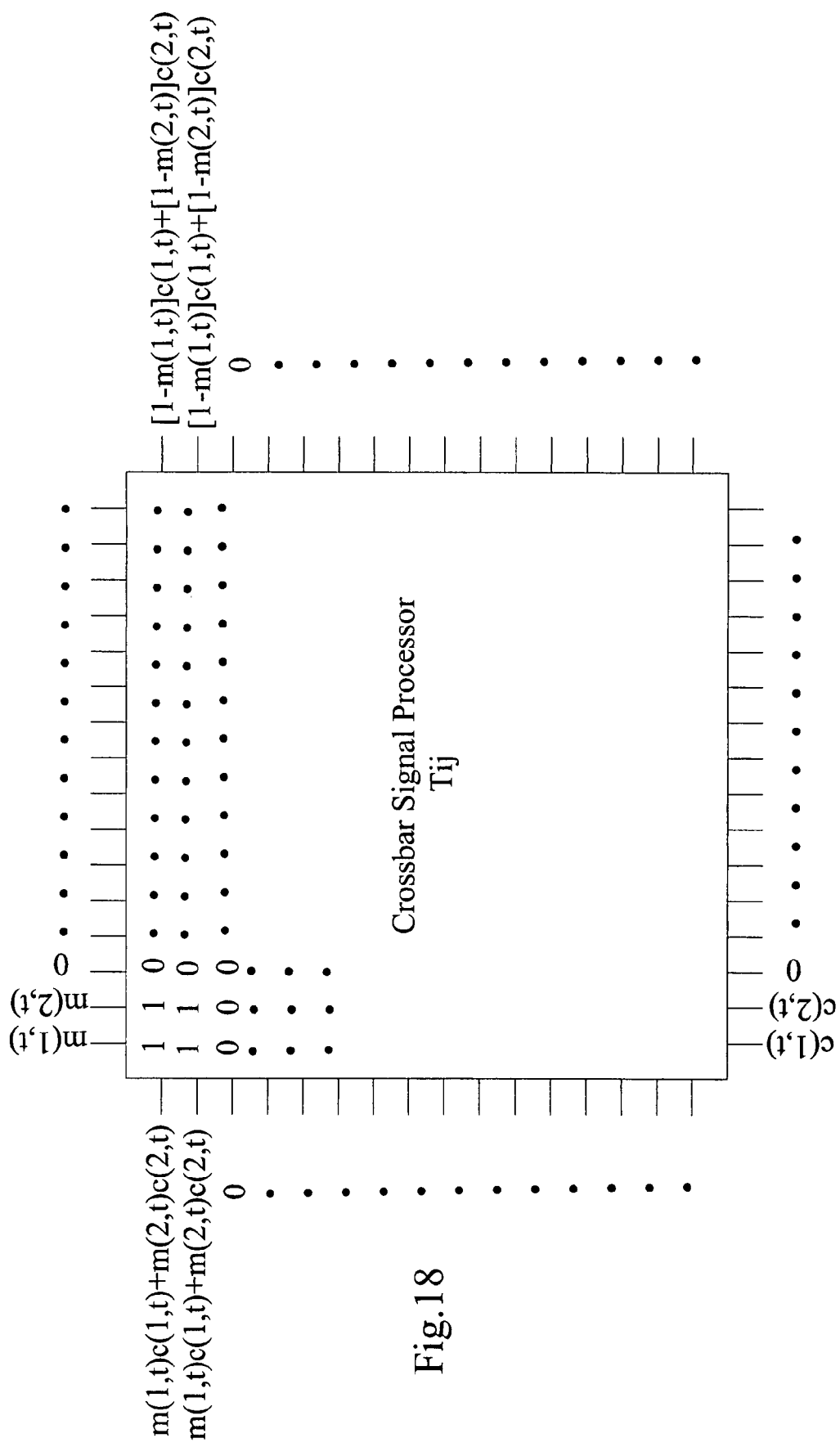

An extension of the principles of FIG. 16 and FIG. 17 provides for frequency hopping. The values of Zij may be changed by reprogramming the Zij value so that instead of T(1,1), T(1,2), T(2,1), T(2,2)=1 and all other T(i,j)=0, as shown in FIG. 18, T(3,1), T(3,2), T(4,1), T(4,2)=1 and all other T(i,j)=0. This would shift the message signals to a different frequency band which is useful in cases where interference or bad transmission is detected from the currently used band.

While the above discussion concerns the crossbar signal processor used in modulation techniques it is noted that demodulation may similarly be achieved with respect to a selected carrier frequency by examining the current passing through Zij. When Vina(i) is a particular modulated signal and Vinb(i) is a selected carrier frequency phase matched to the modulated signal no current will flow through Zij when the modulated signal matches the carrier frequency (provided Zina(i)=Zinb(i), see FIG. 13c). For demodulation applications a detection circuit may be added to the crossbar signal processor to detect when the current across Zij is zero and thus enable reconstruction of the message signal.

Figure 19:
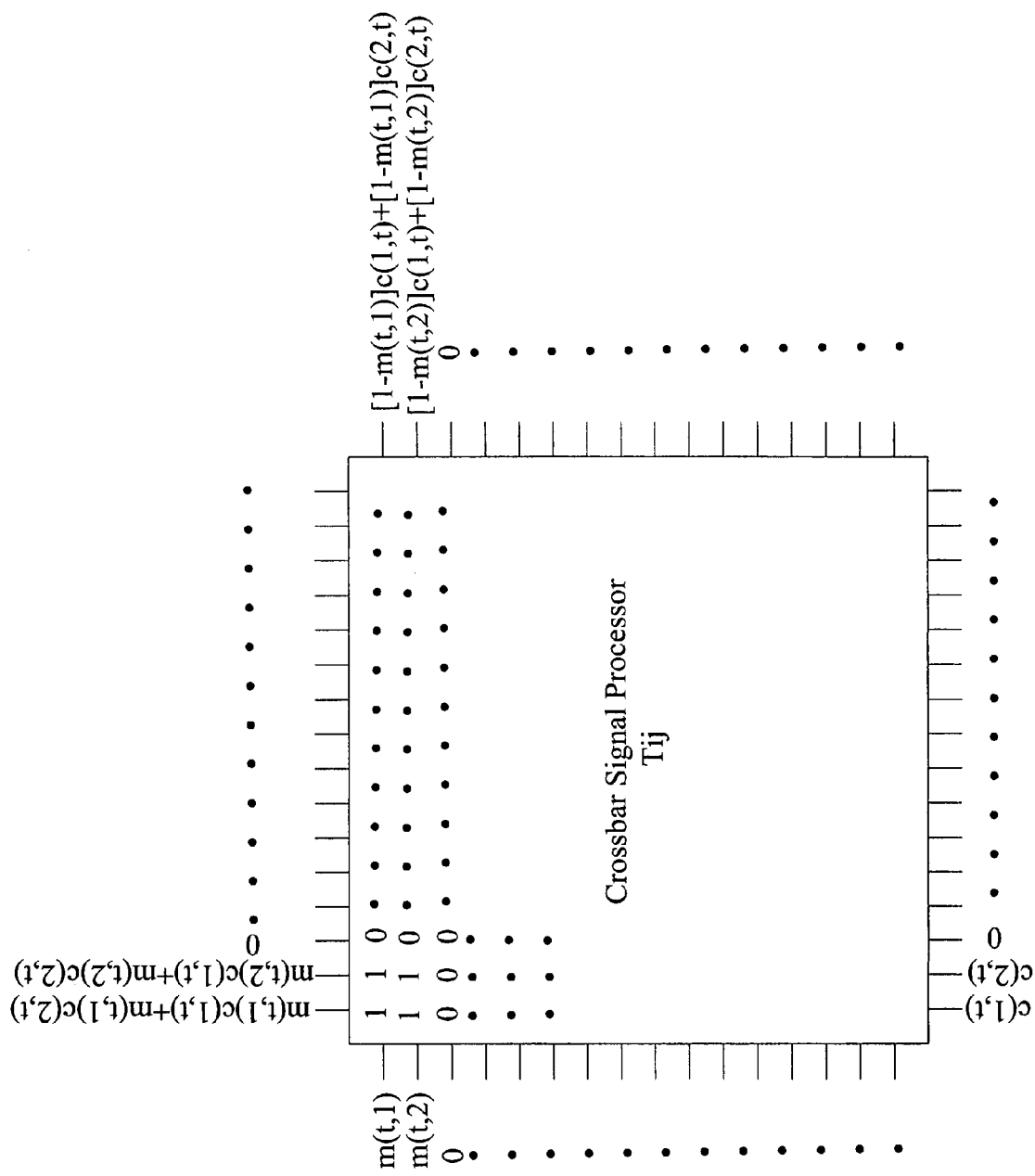
FIG. 19 illustrates an implementation of the reprogrammable crossbar processor of FIGS. 12a and 12b in signal modulation.

The above discussion focuses on communication applications using the embodiment of FIGS. 11a and 11b. However, the embodiment of FIGS. 12a and 12b may similarly be used. In this case the outputs may be expressed as:

$$Vouta(i)=\Sigma Tij[Vmaxa(i)-Vinb(j)]\delta(Vina(i),Vinb(j)+V_{Tij}), \text{ the summation performed for } 1\leq j\leq 16. \quad (Eq20a)$$

$$Voutb(j)=\Sigma Tij[Vinb(j)-Vmina(i)]\delta(Vinb(j),Vina(i)+V_{Tij}), \text{ the summation performed for } 1\leq i\leq 16. \quad (Eq20b)$$

where Vmaxa(i) is the peak amplitude of Vina(i), Vmina(i) is the minimum amplitude of Vina(i), and $\delta(x,y)$ is 0 if $x\leq y$ and 1 otherwise. FIG. 19 shows an implementation of a crossbar signal processor of this type in which Vmaxa(i)=1, Vmina(i)=0, Vina(i)=c(i,t), and Vinb(j)=m(t,j). This implementation may be used for providing a common message signal to a plurality of different carriers or for frequency hopping a single message signal among a plurality of carrier signals. One particular application of frequency hopping is to provide a secure communication channel wherein a first user transmitting a signal and a second user receiving the signal share a common key that corresponds to the order of carrier signals to which the message signal is switched. Another application is to prevent jamming or interference by detecting which frequencies are transmittable and which are non-transmittable at any given time and selecting the carrier frequency based on such detection.

Thus given the above description, the crossbar signal processor provides a versatile tool for communication. It is noted that it is possible for a single crossbar signal processor to switch between different modulation or demodulation schemes by reprogramming the crossbar Zij values and appropriately selecting the input signals. Fine control of the Zij values may also compensate for resistance variation caused by external environmental effects such as temperature. These advantages are seen to provide significant improvements over hardwired communication systems which are functionally limited by the specific circuitry used.

IX. Applications in Pattern Recognition, Pattern Location, and Pattern Comparison In the previous sections the input signals to the crossbar array were generally in the form of waveforms or pulses, however applications exist in which the input signals may be in the form of rasterized digital information such as a two dimensional bit pattern. As described below a crossbar signal processor may be advantageously applied in pattern recognition using such input data.

Supposing one wanted to compare two sets of digital data Aij and Bij each consisting of blocks of binary data. Since the blocks of data are in binary form, then the XNOR logic operation A*B+!A*!B (!=NOT,*=AND,+=OR) may be used on each bit position and summed producing the value X=Σ[Aij*Bij+!Aij*!Bij] the sum performed over all i and j. For perfect matching the sum should equal the total number of bits in the data set. For an N×M block of bits this value is the product of N times M. Thus a normalized correlation can be expressed as $$X=\Sigma[Aij*Bij+!Aij*!Bij]/(NM) \quad (Eq21)$$

the sum performed from $1\leq i\leq N$ and $1\leq j\leq M$.

where X=1 corresponds to perfect correlation and X=0 corresponds to perfect anti-correlation (this would actually be indicative of Bij=!Aij meaning Bij is a negative of Aij). A value of X=1/2 would be expected for no correlation when the probability of any particular bit value being one is equal to the probability that the bit value is zero (i.e. perfect entropy).

If the data block sizes are 1000×1000 and a single XNOR operation counted as a single step it would take 1,000,000 steps to compute X. However, if an entire row ($1\leq j\leq M$) or column ($1\leq i\leq N$) could be summed in a single process step it would greatly reduce the number of computations necessary to find X. Using the signal processing crossbar array of the present invention provides a mechanism for such computation reduction.

Figure 20:
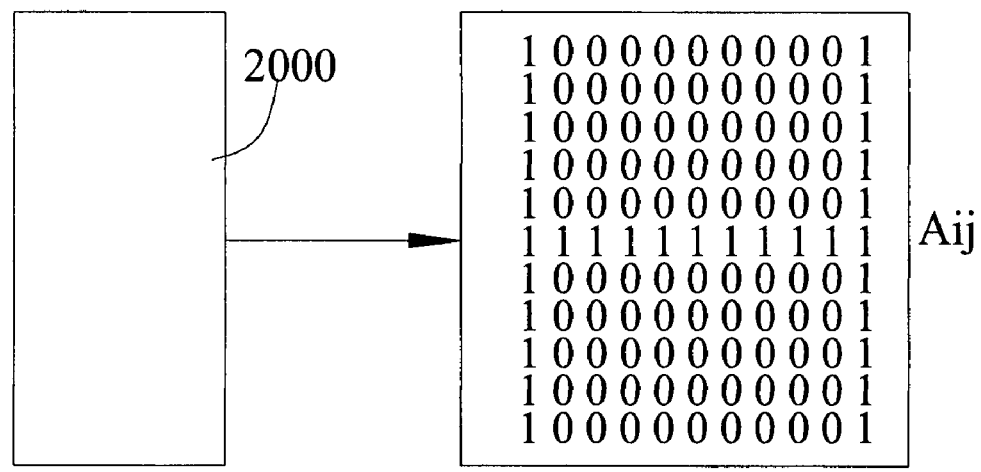
FIG. 20 illustrates inputting of bit data block Aij and generation of corresponding bit data blocks !Aij, Aji, and !Aji.

FIG. 20 illustrates digital data Aij received from a source 2000 which may be a data buffer, an imaging sensor such as a CCD or CMOS sensing array, or any other data source containing patterns that are desired to be analyzed. The digital data Aij is represented in FIG. 20 as a pattern in an "H" shape. Using a general purpose microprocessor the digital data Aij may be used to generate three additional blocks of digital data: !(Aij), Aji, and !(Aji) as shown in FIG. 20. Alternatively preprocessing circuitry, such as an inverter array, may be added to the input unit of crossbar processors to generate !Aij and an additional crossbar array and latching circuitry may be added to the input of a crossbar processor so as to rotate input Aij and generate Aji. Each of the four data blocks may be programmed into separate crossbar signal processors with Zij=low value corresponding to Tij=1 and Zij=high value corresponding to Tij=0 (see Eq10 and/or Eq19).

Figure 21:
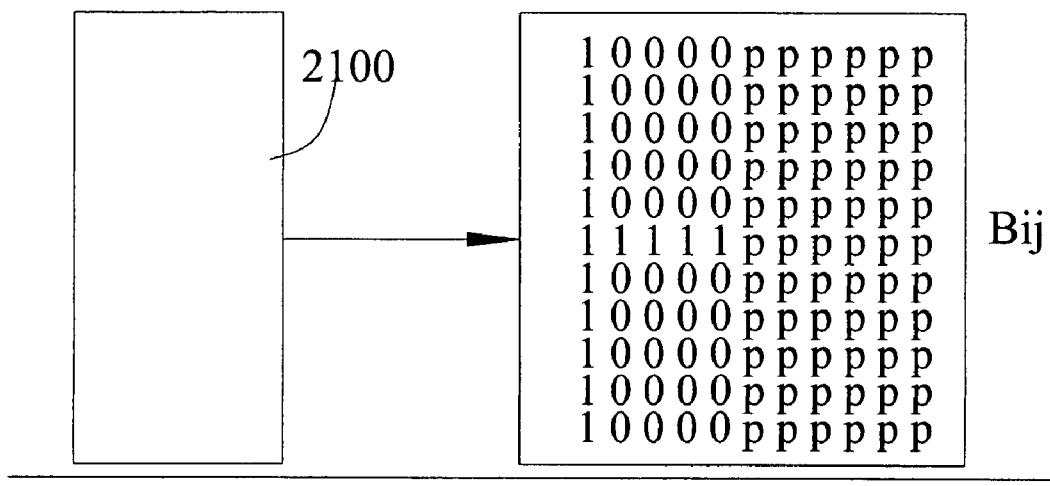
FIG. 21 illustrates inputting of bit data block Bij and generation of corresponding bit data blocks !Bij, Bji, and !Bji.

FIG. 21 illustrates digital data Bij received from source 2100 at a later time. Source 2100 may be a data buffer, an imaging sensor such as a CCD or CMOS imaging array, or any other data source containing patterns that are desired to be analyzed. In some embodiments source 2100 may be the same as source 2000. In the current example, Bij is the same as Aij except that the right half side of data Bij is corrupted so that a probability p exists of a given bit being 1 and !p represents a probability of a given bit being zero (!p=1−p). As in the case of Aij, Bij may be used to generate three additional blocks of digital data: !(Bij), Bji, and !(Bji). Each of the four data blocks Bij, !(Bij), Bji, and !(Bji) may then be input one row at a time to corresponding crossbar arrays programmed with the data Aij, !(Aij), Aji, and !(Aji). As the first row of each data block (for example Bij) is input the corresponding output row of the crossbar array processor may be examined. At points in which there is a match between a particular input value (for example $B_{11}$ corresponding to a high voltage input, i.e. $B_{11}=1$) and the corresponding programmed value ($A_{11}$ corresponding to a programmed low resistance state $A_{11}=1$) current will be transmitted along the top row conduction path. If a particular input value is a low voltage input ($B_{21}=0$) and the corresponding programmed value is a high resistance state ($A_{21}=0$) current will not be transmitted along the top row conduction path. If the programmed state and the corresponding input state are different there will also be little current flow. TABLE 3 summarizes these conditions:

TABLE 3

| Aij | Bij | Output |
|---|---|---|
| 0 = High resistance state (i.e. Zij = HIGH, Tij = LOW) | 0 = (Low voltage input) | 0 = No current |
| 0 = High resistance state (i.e. Zij = HIGH, Tij = LOW) | 1 = (High voltage input) | 0 = very little current |
| 1 = Low resistance state (i.e. Zij = LOW, Tij = HIGH) | 0 = (Low voltage input) | 0 = very little current |
| 1 = Low resistance state (i.e. Zij = LOW, Tij = HIGH) | 1 = (High voltage input) | 1 = current |

Figure 22D:
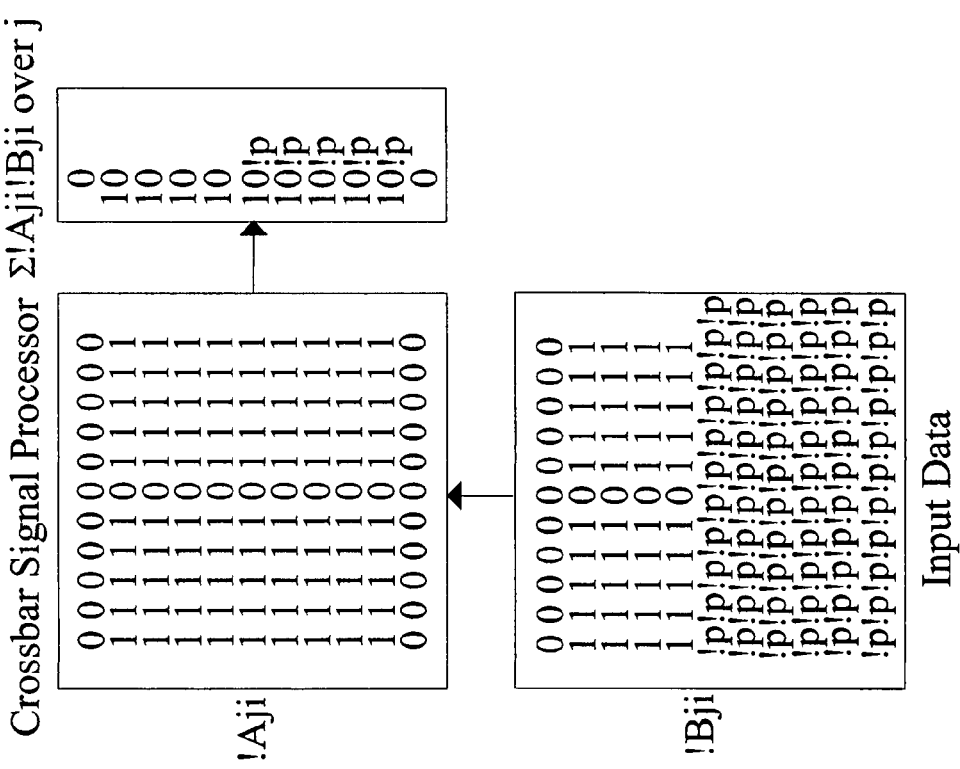
Figure 22C:
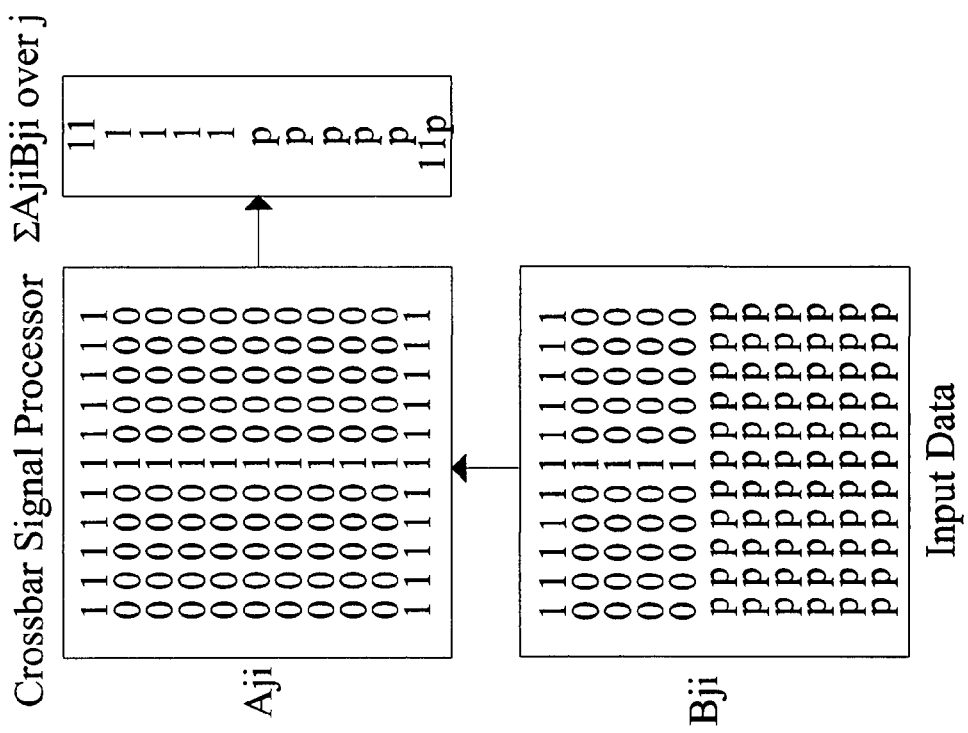
Figure 23B:
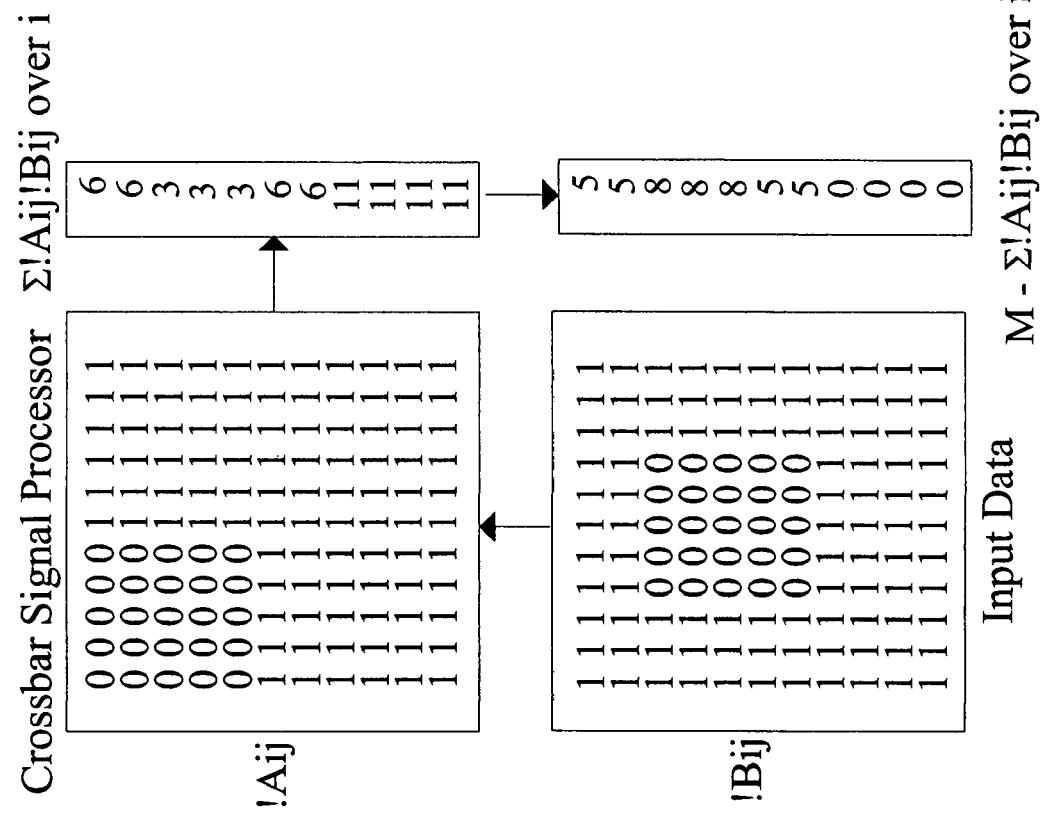
Figure 23A:
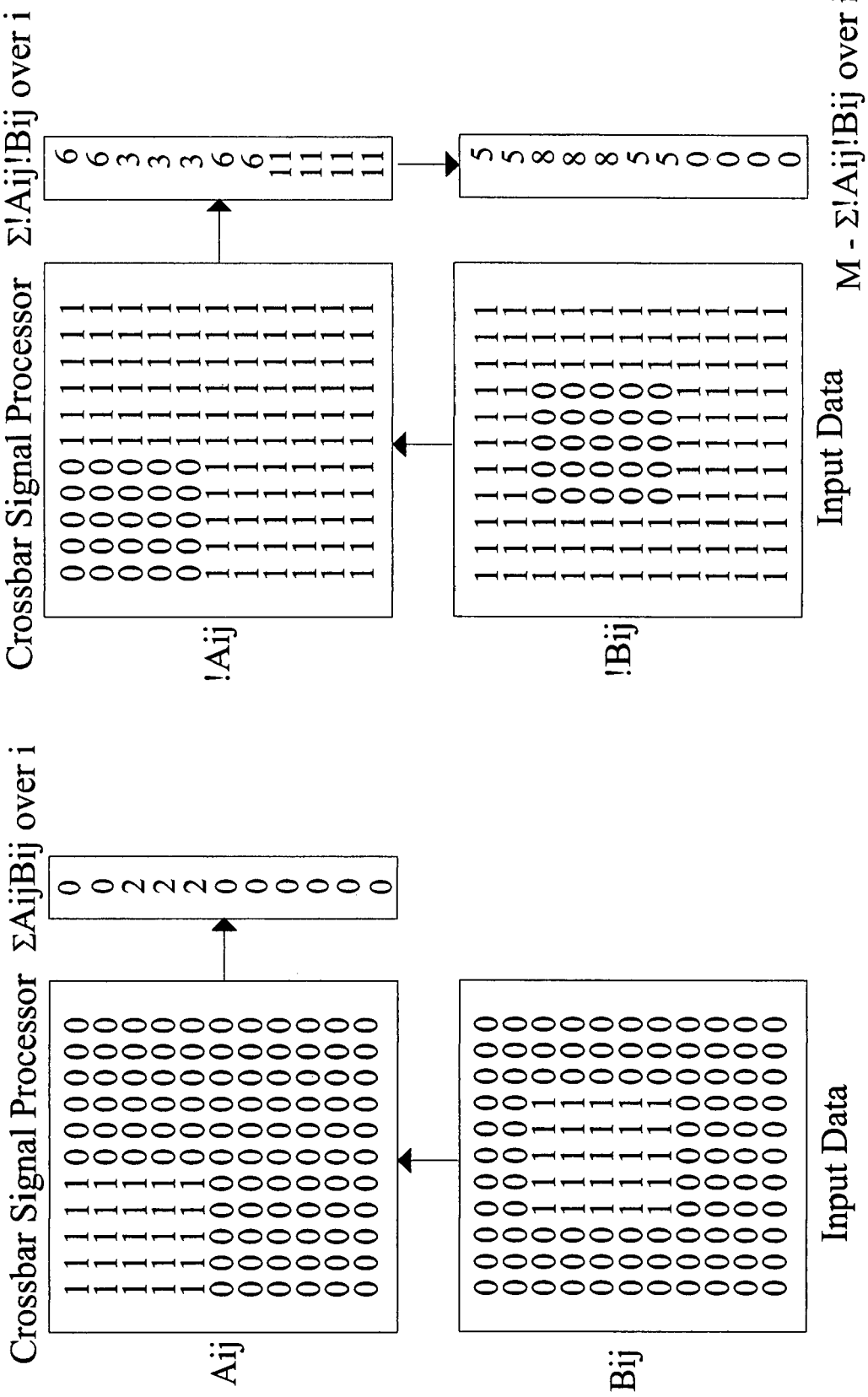

Since each row conductor output of the crossbar array is connected to an operational amplifier, each row output from the op amp will be an analog sum of the input voltages that pass through the crossbar array. Taking FIG. 22a as an example, the output for the first row of input data Bij processed by the first row of stored data Aij is 1+p because only either end of the programmed pattern Aij is at a low resistance state and the upper left most value of Bij is 1 while the upper right most value is 1 with a probability p. The output value from the first row may be sent to an analog to digital converter and then stored in a data register or stored in analog form via a capacitor or other analog storage mechanism. Inputting the second row of Bij into the programmed crossbar array produces a second analog output at the second row output which may also be stored in a data register after A/D conversion or via an analog storage method. This process may be repeated for as many rows of data that there are to be analyzed with the total number of process steps equaling the number of rows. It is noted that as each row is processed the other rows are in the non-conducting by setting the appropriate values to actives(j) (see FIG. 7d) via a shift register or the like shifting a single bit to sequentially actuate the outputs in a simultaneously timed relationship to the input of each row of data block Bij.

Using four different crossbar array processors the four input data blocks Bij,!Bij, Bji, !Bji may be simultaneously processed as indicated in FIGS. 22a-22d. However, if it is desired to minimize the number of circuit components a single crossbar array processor may be used and repeatedly reprogrammed with the data blocks Aij, !Aij, Aji, !Aji at the cost of reduced processing speed (effectively reducing the number of required circuit components by four but increasing the processing time by four as well).

As indicated in FIG. 22e, the analog output values or analog to digitally converted values obtained from the first crossbar processor representing ΣAij!Bij summed over i may be added to those obtained from Σ!Aij !Bij summed over i thus producing a XNOR operation for each row Dj=Σ[AijBij+!Aij!Bij]. The resultant Dj is representative of a vector indicating the degree of correlation in the vertical (j) direction between the input data (Bij) and the stored data (Aij). One may normalize Dj by dividing Dj by the number of rows M or by dividing by the largest individual value in the vector. As the current example indicated the error is evenly distributed along the i-axis when the probability p=0.5 (maximum entropy) which is in accordance with the intuitively expected result. Ci may be obtained similarly as Ci=Σ[AjiBji+!Aji!Bji] by adding the analog, or analog to digitally converted, outputs from the third and fourth crossbars. Ci is representative of a vector indicating the degree of correlation in the horizontal (i) direction between the input data (Bij) and the stored data (Aij). As the current example indicates the normalization of Ci when p=0.5 produces the intuitive result that the right side of the input data pattern (Bij) is anomalous while the left side matches the stored data pattern. The total amount of processing steps for this comparison when four different crossbar processors of size 1000×1000 are used would equal 1000 steps (one each for comparing each input data row and storing the corresponding analog or A/D converted output row) plus 1 step (for adding the stored resultants of the first and second crossbar processors to produce Dj and adding the stored resultants of the third and fourth crossbar processors to produce Ci). Using a 1 MHz processor 1000 images consisting of 1000 by 1000 bit patterns may be compared to a reference pattern in approximately 1 second. Using a 1 GHz processor 1,000,000 images consisting of 1000 by 1000 bit patterns may be compared to a reference pattern in 1 second. Thus this is seen to significantly improve the speed of pattern recognition and pattern comparison over more conventional techniques employing individual logic gates.

Some limitations of the above approach are noted, however. For a 1000×1000 crossbar array that has a particular row with all the Zij values programmed at a low resistance state and an input of all high voltages the output produced would maximally be 1000 times the high input voltage. If 100 mV were used as the HIGH input value the output would on the order of 100V provided there was matching between the input and output impedances (Zin(i)=Zout(j)). Thus increasing the total number of columns in the crossbar array may require use of output circuitry capable of dealing with higher voltages. Also, as with all electronic devices which may produce large currents during certain periods, adequate cooling and temperature regulation is a concern. One of ordinary skill in the art would recognize the variety of thermal compensation solutions available from conventional electronics such as heat sinks, etc. It would also be recognized by a person of ordinary skill that conventional software based techniques of pattern recognition and comparison including various filtering, preprocessing and post-processing techniques may be combined with the crossbar processor of the present invention.

FIGS. 23a-23e illustrates a second pattern processing methodology using the crossbar signal processor. Instead of performing pattern comparison the crossbar processor of the present invention may be used for pattern location and tracking. A first set of patterns Aij, !Aij, Aji, and !Aji is stored in the crossbar array as in the previous example and corresponding input patterns Bij, !Bij, Bji, !Bji are later detected by a CCD array or received from a pattern buffer.

The input patterns are processed by the respective stored patterns producing analog, or A/D converted, output vectors as in the last example except this time the output vectors Σ!Aij!Bij and Σ!Aji!Bji are complemented to form the vectors M−Σ!Aij !Bij and N−Σ!Aji!Bji, where N is the number of columns and M is the number of rows in a particular crossbar. This is done so as to reverse the dark background values caused by the !Aij=1 values. In the case where the stored data patterns Aij and Aji are detected to have a dark background, !Aij and !Aji would have a light background, and this complementing step may be performed for the outputs produced from Aij and Aji instead.

Horizontal and vertical correlation vectors, Ci and Dj, are obtained as indicated in FIG. 23e. These vectors may be independently assessed or used to generate a normalized outer product DjCi/4NM that indicates the dislocation of the input image pattern Bij from the stored image pattern Aij. This dislocation may be used to reposition or refocus a CCD or CMOS camera or other imaging device that is the source of the data patterns. Repeating this process once every predetermined time period enables object tracking. Depending on the magnitude of the dislocation detected the predetermined time period may be readjusted to compensate for the tracked objects relative speed. For example, a relatively fast moving object may require a time difference between original image capture and correlation with the next image to be performed once every millisecond while a relatively slow moving object may require a time difference between an image capture and correlation once every tenth of a second. Detection of changing speed may be used to dynamically adjust the time difference while tracking. This may be useful in a wide variety of applications such as position tracking in an optical computer mouse, tracking a projectile or a missile, adjusting a lithographic mask, and in machine vision.

Figure 24:
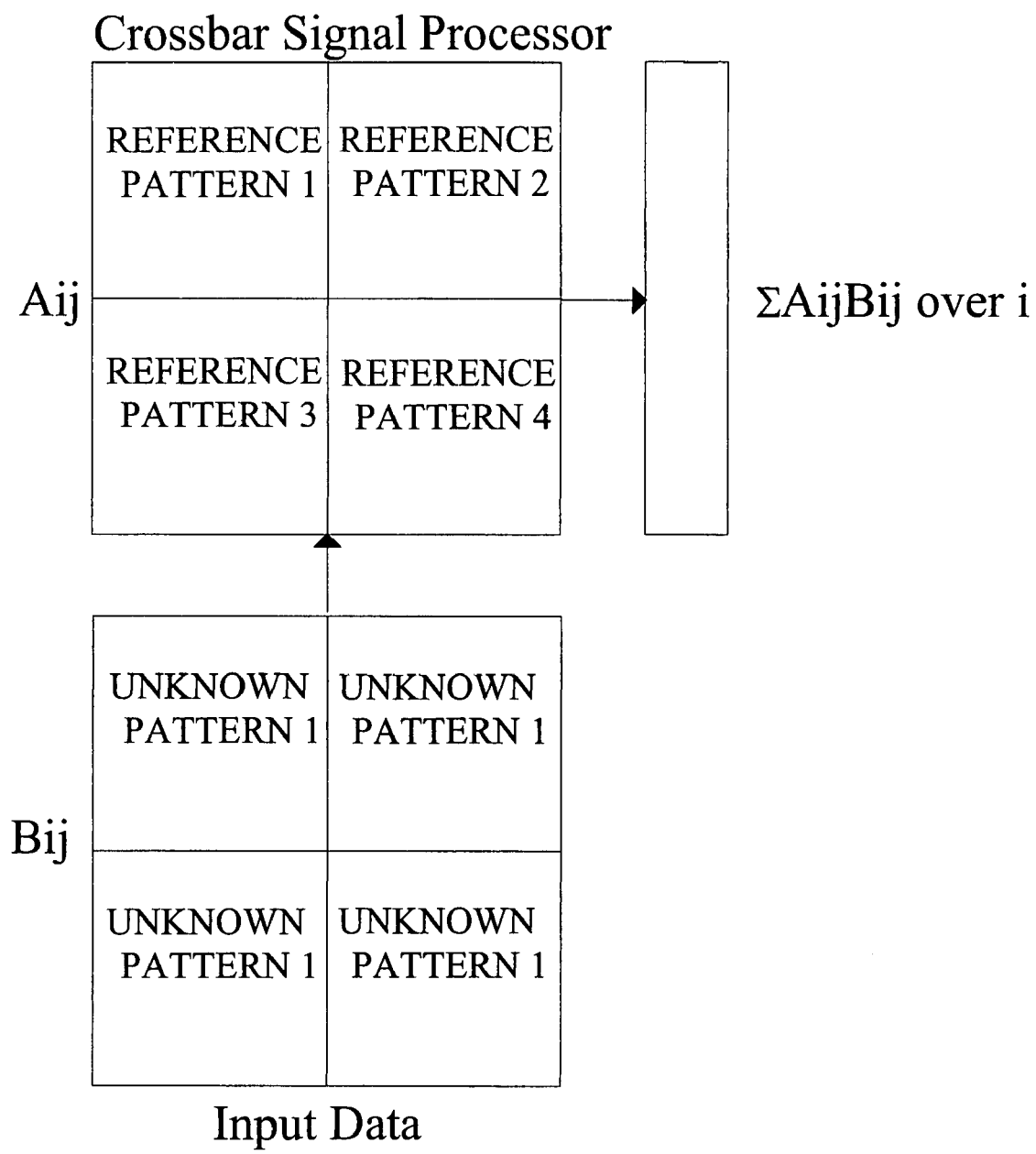
FIG. 24 illustrates a technique of pattern matching using a crossbar processor.

FIG. 24 displays another example of the use of a crossbar signal processor in pattern matching. Instead of a single pattern being programmed into the crossbar processors, Aij may contain multiple different reference patterns. A single unknown pattern may be duplicated in an array and input to the crossbar processor to create input pattern Bij. Using the techniques of FIGS. 22a-e the location of the closest match will correspond to the range of maximum values within the horizontal and vertical correlation vectors Ci and Dj.

It would be recognized by a person of ordinary skill that conventional software based techniques of pattern recognition, pattern tracking, and pattern comparison including various filtering, preprocessing and post-processing techniques may be combined with the crossbar processor of the present invention.

X. Interfacing Molecular Crossbars With Solid State Electronics

For the case of a crossbar employing conductive wires with diameters in the 100 nanometer—100 micrometer range, connection with the input and output circuitry may be obtained through conventional microlithography techniques. For wires with larger diameters, solder connections may be formed. However, for wires with diameters less than 100 nm, such as in the molecular nanowire crossbar structures noted in the Background of the Invention, special consideration in how to interface conventional electronics with the crossbar wiring may be necessary.

Scanning probe microscopes including atomic force microscopes (AFMs) and scanning tunneling microscopes (STMs) are one possible mechanism for achieving such interfacing. AFMs can include an ultrasharp conductive tip capable of conventional current conduction and STMs include a tip capable of tunneling current conduction. Setting the scanning probe tip to a desired potential via control electronics and positioning the tip into contact with a nanowire may allow for a signal transmission from the control electronics to the nanowire crossbar.

Figure 25A:
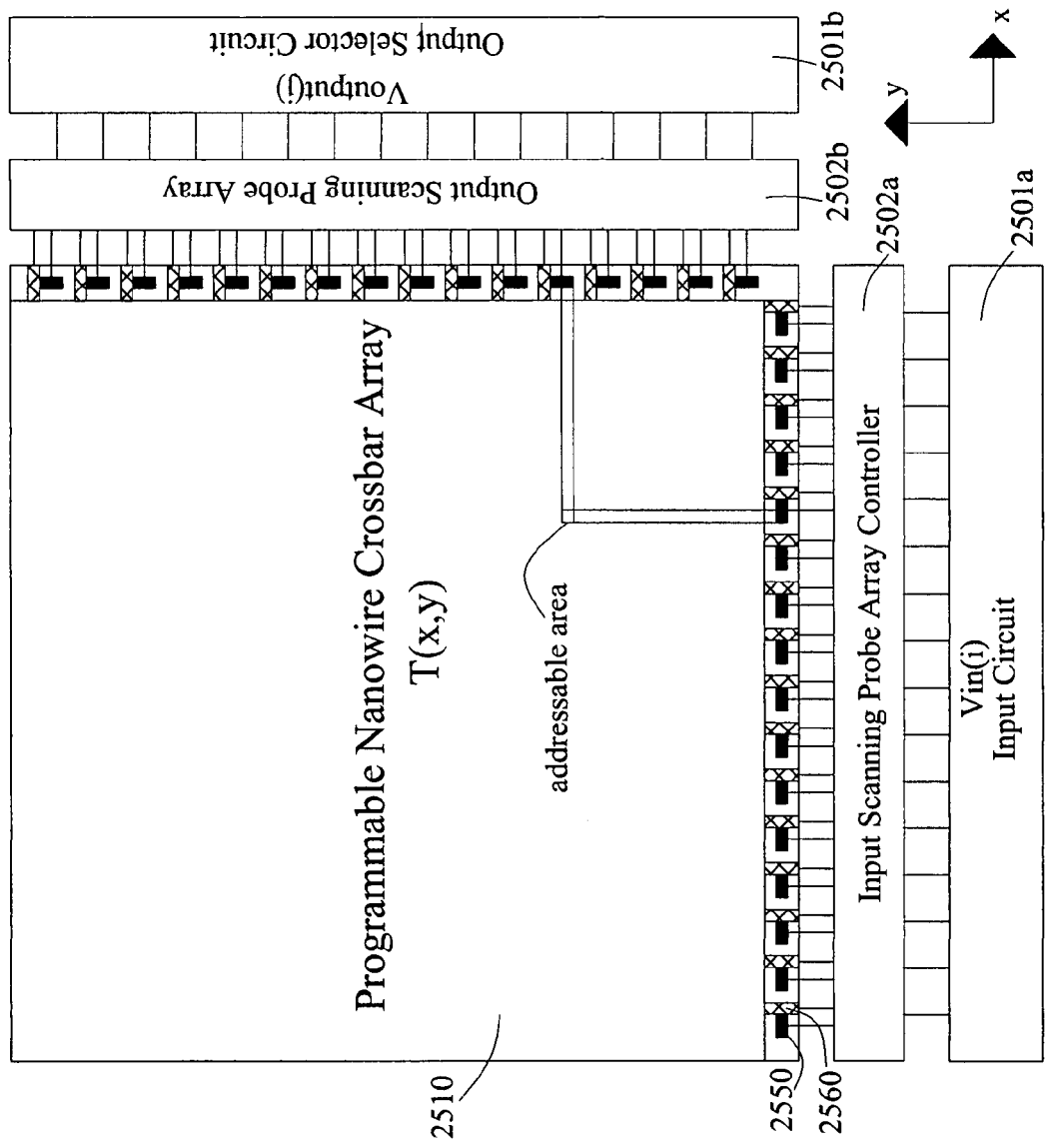
FIGS. 25a-25b illustrate using scanning probe tips connected to independently movable cantilevers in addressing crossbar intersection points within a crossbar array.

FIG. 25a illustrates an array of scanning probes formed over the input and output edges of a nanowire crossbar array 2510. Each scanning probe tip may be integrally formed on a respective cantilever 2550 with a positioning control mechanism such as a piezoelectric or electrostatic actuator 2560 using microelectromechanical fabrication techniques. Shinjo et al. U.S. Pat. No. 5,412,641 provides one example of an integrally formed scanning probe array. The substrate out of which the scanning probes are formed may be positioned parallel to the surface of the crossbar array. As shown in FIG. 25a, only two edges of the crossbar array are surrounded by scanning probes, however all four edges may be provided with scanning probe tips if configurations analogous to that of FIG. 11a or 12a are desired.

Input circuit 2501a provides the programming input, signal input, and input selection circuitry while output circuit 2501b provides the programming output, signal output, and output selection circuitry. Scanning Probe Array Controllers 2502a and 2502b generate the voltage control for the scanning probe tips as well as positioning signals to control the positioning mechanisms 2560. If AFMs are used, optical sensing of the cantilever position maybe used for feedback positioning regulation as well known in the art of scanning probe microscopy.

Figure 25B:
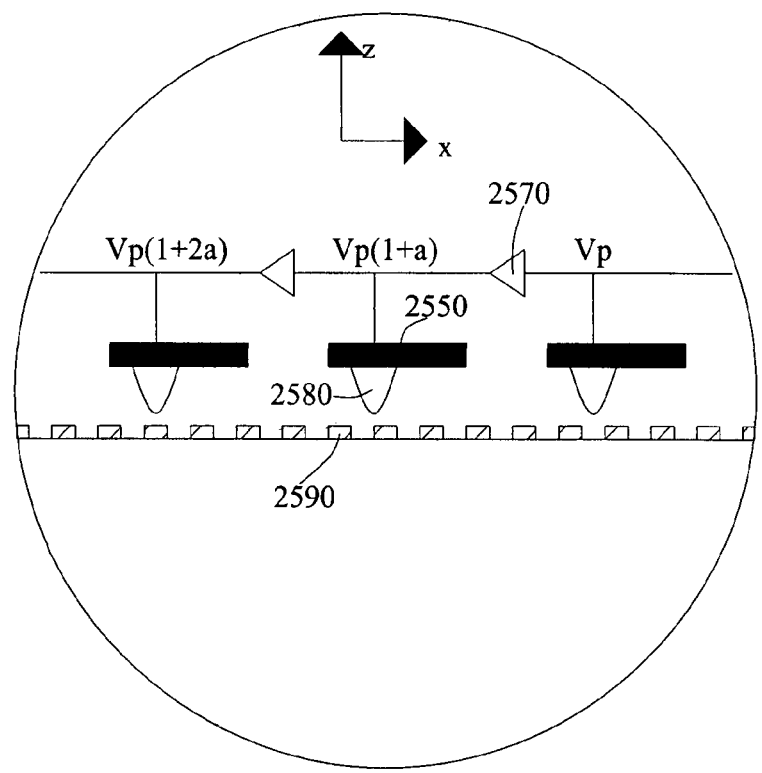

As indicated in FIG. 25b, each scanning probe tip 2580 may correspond to a plurality of nanowires 2590. For example, with a spacing of 100 microns between tips, a range of movement of 10 microns per tip, a nanowire diameter of 10 nm, and a spacing of 10 nm between each wire, 500 nanowires may be addressed per tip. Providing a tip radius that encompasses many nanowires may be useful in order to provide redundancy for poorly conducting or broken nanowires. A 100 nm tip diameter may concurrently contact 5 nanowires at a time as the tip 2580 is scanned in the x direction. In this case the addressable area for a particular input scanning probe/output scanning probe pairing may produce 100×100=10,000 programmable regions with each addressable area including 5×5=25 crosspoints between the overlapping 5 nanowire input/5 nanowire output combination. To compensate for increased parasitic resistance for longer wire paths from the input to the output, a series of amplifiers 2570 may be used to boost the input drive voltages Vp by an amount "a" corresponding to the expected voltage drop between consecutive scanning probe tips.

The configuration of FIGS. 25a and 25b provides for nanowire addressing of only a fraction of the crossbar interconnects. For example, if a 10×10 scanning probe input/output array is provided, and given the parameters of the example from the preceding paragraph, 100×10,000=1,000,000 programmable regions are possible. However, for a 1000 micron×1000 micron area, corresponding to an area covered by the 10×10 scanning probe array with a 100 micron interspacing, $10^{10}$ intersection points of the nanowires may be achieved with $10^{10}/25$ programmable regions. The deficiency between the maximum number of programmable regions and the value obtained in the current example may be reduced by increasing the scanning range of the scanning probes. To increase the maximum allowable scanning range of each individual scanning probe tip the cantilever 2550 from which the tips 2580 are formed may be arranged perpendicular to the associated edge of the crossbar array rather than parallel to the associated edge.

During programming of the nanowire crossbar array the output array of scanning probe tips should be held in a fixed position in contact with a first set of output nanowires with the tip voltages set to ground. The input array of scanning probe tips may then be continuously scanned in the x-direction to sequentially address the nanowires that are in contact with the tip at any given time. Coordinated control of the voltage of the tip with the scanning speed will determine the amount of impedance change in the programmable material. This may be used to supplement or replace the pulse width modulation of the programming circuit that was used in programming individual impedances in previous embodiments. Once one line of programming is performed the output scanning probes may be incremented in the y-direction while the input scanning probes are returned to the origin for a second scan. Alternatively, bi-directional programming scans may be employed with the direction of data input being switched when programming alternate rows. Repeatedly scanning the input scanning probes in the x-direction followed by incrementing the position of the output scanning probes in the y-direction results in programming all accessible programming regions.

Figure 26B:
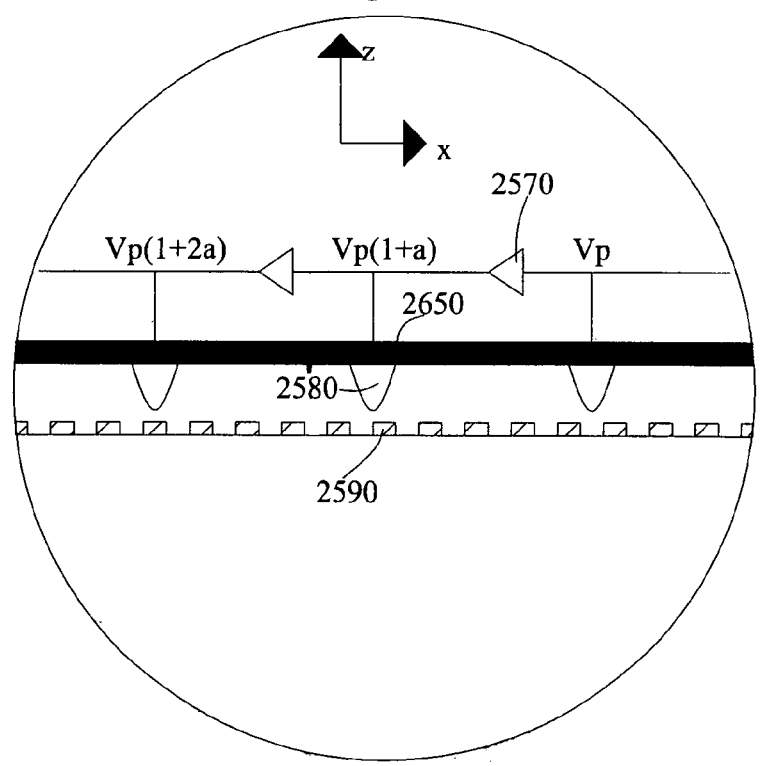
FIGS. 26a-26b illustrate using scanning probe tips connected to a common support in addressing crossbar intersection points within a crossbar array.
Figure 26A:
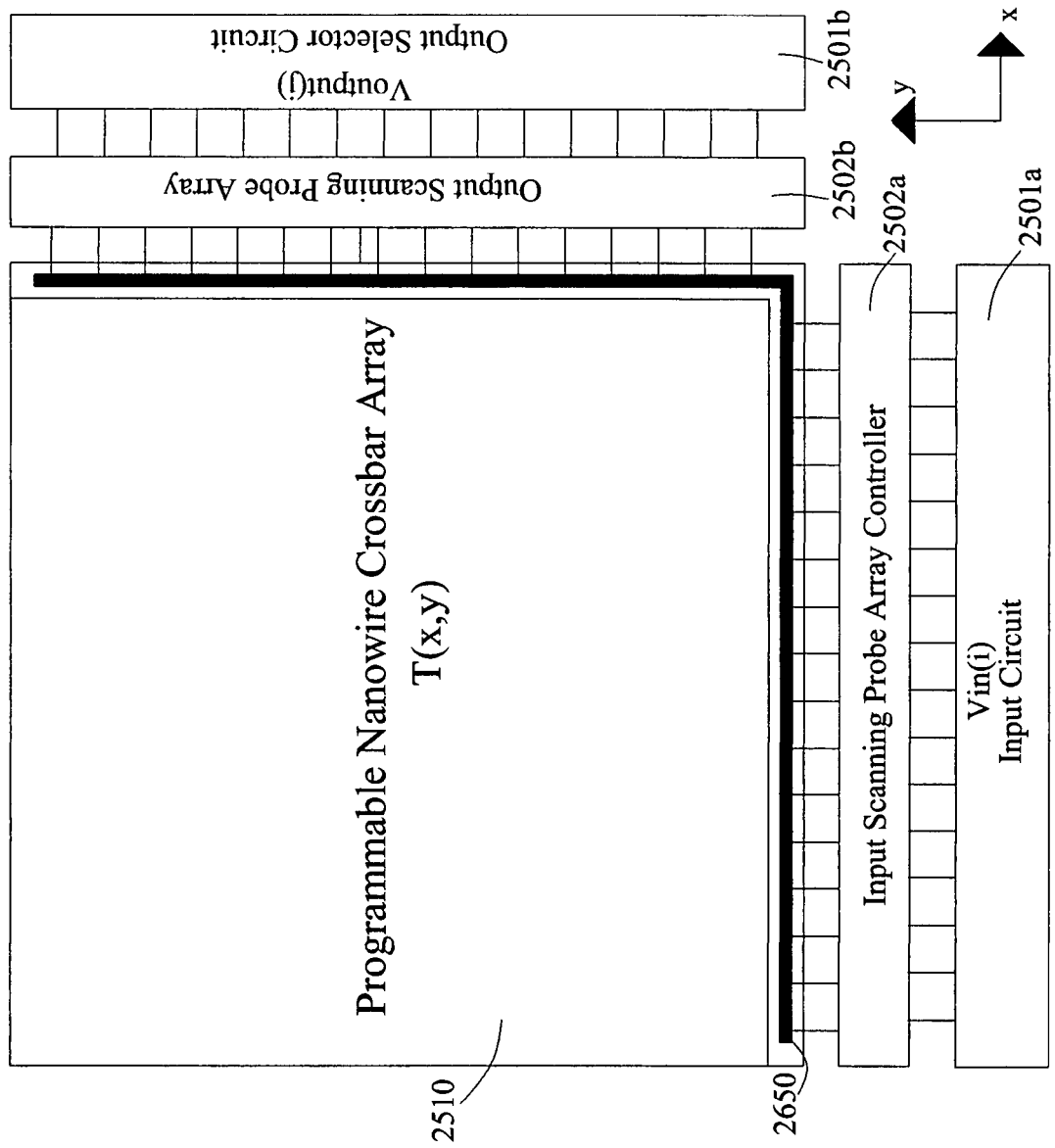

FIG. 26a illustrates an alternative embodiment in which, instead of separate positioning mechanisms 2560 and cantilevers 2550, a common support 2650 is provided for the tips 2580. The support 2650 may be repositioned via a common XY positioning mechanism. This allows for closer spacing between adjacent tips. Minimal spacing may be achievable using high aspect ratio tips such as carbon nanotubes which have been formed in vertical arrays with interspacings on the order of 10 s of nanometers between nanotubes.

Incidentally, the scanning probe interconnection system may also be usefully applied to interconnect crossbar nanowire memory systems, or other nanowire crossbar systems other than used in signal processing, to solid state control circuitry.

XI. Modifications/Alternatives

Many modifications and alternatives to the current invention may of course be implemented and a person of ordinary skill in a variety of technical arts such as waveform generation, signal analysis, control systems, communication systems, pattern recognition systems, artificial intelligence, scanning probe microscopy, and programmable materials would clearly see many obvious variants to the teachings contained herein. For example, while crossbar arrays have typically been formed from two sets of wires that are orthogonal to each other they may also be formed from intersecting wires formed at a non-orthogonal angle such as 80 degrees, 60 degrees, 45 degrees, 30 degrees, etc. While examples were given of a 16×16 crossbar array for some embodiments of the current invention other configurations such as a 2×2 crossbar array, 1×1028 crossbar array, 1028×1 crossbar array, 1028×1028 crossbar array, or any value in between is conceivable.

As noted in the Background of the Invention a variety of candidates exist for the programmable material of the crossbar array including conducting polymers, organic semiconductors, perovskite materials, silver-selenide/chalcogenide laminate films, as well as molecular components such as rotaxane used in nanowire crossbars. In addition a variety of materials with voltage controlled resistive and/or capacitive properties exist that have not yet been used in crossbar arrays. For example, Nugent U.S. Pat. No. 6,995,649 discloses using voltage controlled orientation of high aspect ratio nanoparticles as a means of variable resistance control. Any known material with a voltage or current controlled resistance or/and reactance may potentially be employed in a useful fashion within the framework of the current invention.

When a particular programmable material/molecule has a conductive state that is still a relatively high impedance low currents will be produced. This may help reduce problems generated by undesired current-induced heating. However, if the current produced is so low that it approaches the level of anomalous currents produced by noise or thermal currents, proper operation will be impeded. To address these problems noise filters may be added to the input and output circuitry and/or cooling may be provided to reduce thermal current.

Figure 27A:
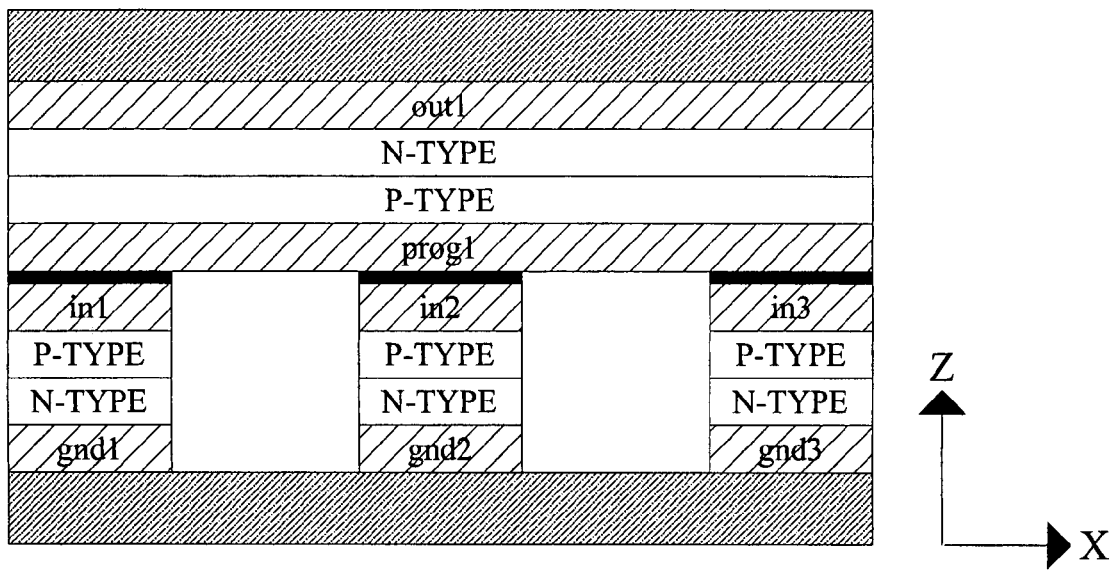
FIGS. 27a-27b illustrate a modification of the crossbar array structure.
Figure 27B:
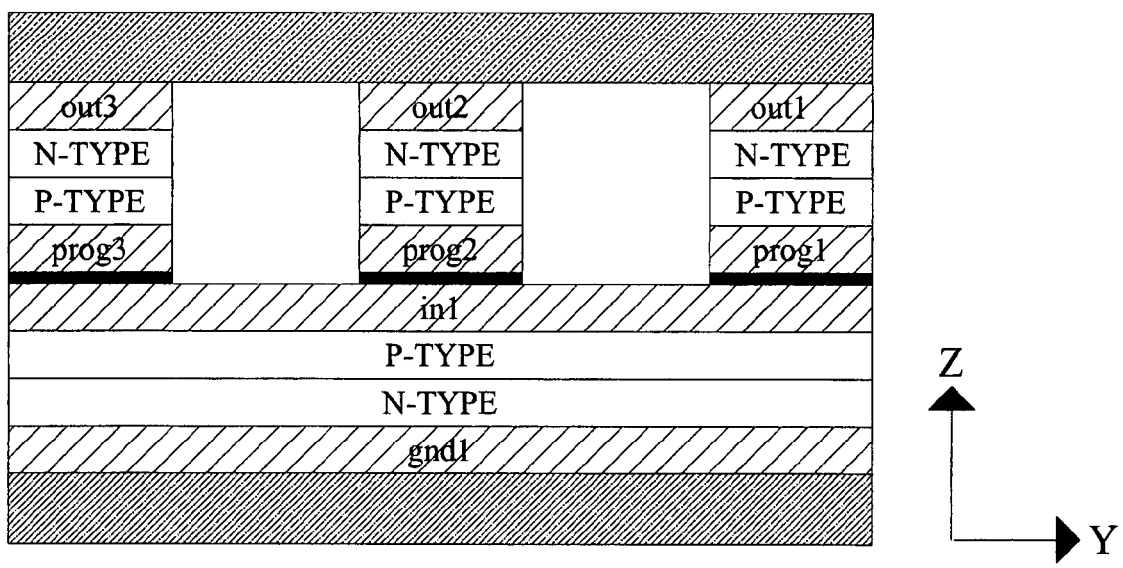

The rectification layers shown in FIGS. 8d, 11b, and 12b are formed as continuous layers. However, some leakage current may be present depending on the interspacing of the wires, the thickness of the rectification layer, and the relative surface resistance of the rectification layer and the wire resistances. To avoid this problem the rectification layer may be segmented into a different portion for each crossbar interconnection point with insulating material provided or empty spaces etched between the different rectifying segments. FIGS. 27a and 27b illustrate cross-sections along the y-axis and x-axis as an example of this construction.

While the present invention was described and various equations were given in terms of programmed impedance or resistance values, an equivalent description may be provided in terms of admittance $Y_{ij}=1/Z_{ij}$ or conductance $G_{ij}=1/R_{ij}$.

As described above many modifications of the present invention are possible and many applications within the realms of signal processing, control systems, communication, and pattern recognition are foreseeable. However, the present invention is only limited by the following claims.

I claim:

1. A device comprising:
   a first crossbar section including a rectifying layer having a first side and a second side, a first array of wires formed above the first side of the rectifying layer, and a second array of wires formed below the second side of the rectifying layer;
   a second crossbar section including a symmetrical structure to the first crossbar section; and
   a programmable material layer between the first crossbar section and the second crossbar section.

2. The device of claim 1 wherein the programmable material layer is formed from a conductive polymer.

3. The device of claim 1 wherein the programmable material layer is formed from an organic semiconductor.

4. The device of claim 1 wherein the programmable material layer is formed from a perovskite material.

5. The device of claim 1 wherein the programmable material layer is formed from a silver-selenide/chalcogenide laminate film.

6. The device of claim 1 wherein the programmable material layer is formed from rotaxane material.

7. The device of claim 1 wherein each of the wires in the first and second array of wires have a cross-sectional area greater than 1 square micron.

8. The device of claim 1 wherein each of the wires in the first and second array of wires have a cross-sectional area less than 1 square micron.

9. The device of claim 1 wherein the programmable material layer is formed using a chalcogenide material.

10. The device of claim 1 wherein the second crossbar section includes a rectifying layer having a first side and a second side, a first array of wires formed above the first side of the rectifying layer, and a second array of wires formed below the second side of the rectifying layer wherein the arrangement of the rectifying layer, first array of wires, and second array of wires of the second crossbar section are symmetrical to the arrangement of the rectifying layer, first array of wires, and second array of wires of the first crossbar section.

* * * * *